United States Patent
Suzuki et al.

(10) Patent No.: US 7,268,713 B2
(45) Date of Patent: Sep. 11, 2007

(54) SUPERCONDUCTING CIRCUIT

(75) Inventors: Hideo Suzuki, Yokohama (JP); Keiichi Tanabe, Mito (JP)

(73) Assignees: Fujitsu Limited, Kawasaki (JP); International Superconductivity Technology Center, The Juridical Foundation, Tokyo (JP)

( * ) Notice: Subject to any disclaimer, the term of this patent is extended or adjusted under 35 U.S.C. 154(b) by 0 days.

(21) Appl. No.: 11/524,205

(22) Filed: Sep. 21, 2006

(65) Prior Publication Data
US 2007/0049097 A1 Mar. 1, 2007

Related U.S. Application Data

(62) Division of application No. 10/927,147, filed on Aug. 27, 2004, now Pat. No. 7,129,870.

(30) Foreign Application Priority Data

| Aug. 29, 2003 | (JP) | ............................. 2003-305959 |
| Mar. 9, 2004 | (JP) | ............................. 2004-066100 |
| Mar. 9, 2004 | (JP) | ............................. 2004-066101 |

(51) Int. Cl.
*H03M 1/00* (2006.01)

(52) U.S. Cl. ..................................... 341/133; 341/143

(58) Field of Classification Search ................. 341/133, 341/143, 155; 326/2, 3, 4, 1; 327/527
See application file for complete search history.

(56) References Cited

U.S. PATENT DOCUMENTS

| 4,039,856 A | 8/1977 | Schlig .......................... 307/212 |
| 4,136,290 A | 1/1979 | Davidson et al. ............ 307/277 |
| 4,365,317 A | 12/1982 | Gheewala ..................... 365/162 |
| 5,012,243 A | 4/1991 | Lee .............................. 341/133 |
| 5,124,583 A | 6/1992 | Hatano et al. ............... 307/476 |
| 5,191,236 A | 3/1993 | Ruby ........................... 307/306 |
| 5,398,030 A * | 3/1995 | Sandell ........................ 341/133 |
| 5,610,857 A * | 3/1997 | Nandakumar ................ 365/162 |
| 5,798,722 A * | 8/1998 | Przybysz et al. ........... 341/133 |

(Continued)

FOREIGN PATENT DOCUMENTS

JP 64-16020 1/1989

OTHER PUBLICATIONS

H. Suzuki, et al.: "Applications of Synchronized Switching in Series-Parallel-Connected Josephson Junctions"; IEEE Transactions on Electron Devices, vol. 37, No. 11, Nov. 1990, pp. 2399-2405.

(Continued)

*Primary Examiner*—Peguy JeanPierre
(74) *Attorney, Agent, or Firm*—Armstrong, Kratz, Quintos, Hanson & Brooks, LLP

(57) ABSTRACT

A circuit includes a latch circuit including a Josephson junction and configured to perform a latch operation based on a hysteresis characteristic in response to a single flux quantum, a load circuit including load inductance and load resistance and coupled to an output of the latch circuit, and a reset circuit provided between the output of the latch circuit and the load circuit and configured to reset the latch circuit a predetermined time after the latch operation by the latch circuit, wherein the Josephson junction is driven by a direct current.

6 Claims, 34 Drawing Sheets

U.S. PATENT DOCUMENTS

| | | | |
|---|---|---|---|
| 5,818,373 A * | 10/1998 | Semenov et al. | 341/133 |
| 6,242,939 B1 | 6/2001 | Nagasawa et al. | 326/3 |
| 6,885,325 B2 * | 4/2005 | Omelyanchouk et al. | 341/133 |
| 7,038,604 B2 * | 5/2006 | Hirano et al. | 341/133 |

OTHER PUBLICATIONS

H. Suzuki, et al.: "Josephson semiconductor interface circuit"; Cryogenics, vol. 30, Dec. 1990, pp. 1005-1008.

J. X. Przybysz, et al.: Interface Circuits for Input and Output of Gigabit per Second Data:, 5th International Superconductive Electronics Conference (ISEC '95); Sep. 18-21, 1995, pp. 304-306.

J. X. Przybysz, et al.: "Interface Circutits for Chip-to-chip Data Transfer at GHz Rates"; IEEE Transactions on Applied Superconductivity, vol. 7, No. 2, Jun. 1997, pp. 2657-2660.

D. L. Miller, et al.; "A Josephson Sigma-Delta Analog-to-Digital Converter Using a High-Jc Process"; 8th International Supercondictive Electronics Conference (ISEC '01), Jun. 2001, pp. 123-124.

K. K. Likharev, et al.: "RSFQ Logic/Memory Family: A New Josephson-Junction Technology for Sub-Terahertz-Clock-Frequency Digital Systems", IEEE transactions on Applied Superconductivity, vol. 1, No. 1, Mar. 1991, pp. 3-28.

* cited by examiner

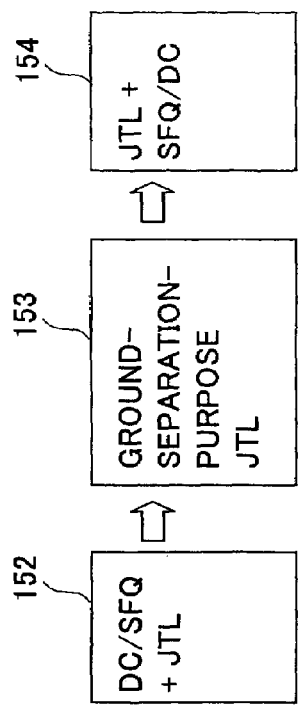
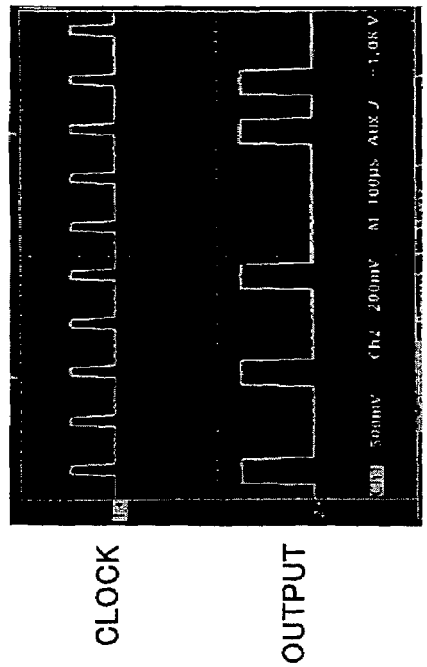
FIG.18C
FIG.18D
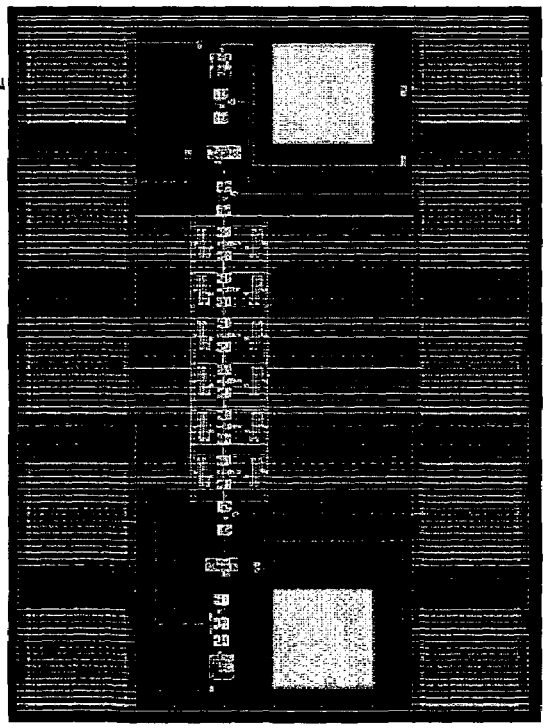
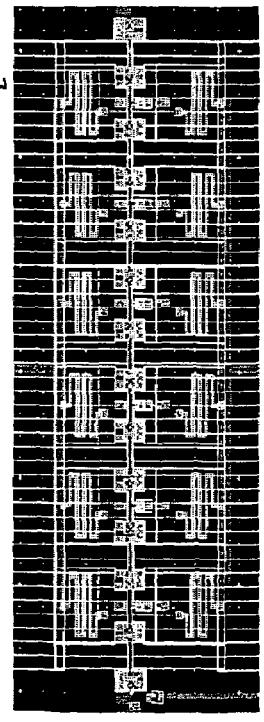
FIG.18A
FIG.18B

SUPERCONDUCTING CIRCUIT

CROSS-REFERENCE TO RELATED APPLICATIONS

This application is a divisional application of U.S. application Ser. No. 10/927,147 filed Aug. 27, 2004, now U.S. Pat. No. 7,129,870 issued Oct. 31, 2006, which patent is based upon and claims the benefit of priority of Japanese Patent Application No. 2003-305959, filed Aug. 29, 2003, Japanese Patent Application No. 2004-066100, filed Mar. 9, 2004, and Japanese Patent Application No. 2004-066101, filed Mar. 9, 2004, the entire contents of which are incorporated herein by reference.

BACKGROUND OF THE INVENTION

1. Field of the Invention

The present invention generally relates to superconducting latch driver circuits, and particularly relates to a superconducting latch driver circuit driven with a DC bias current.

2. Description of the Related Art

As a macroscopic quantum effect of a superconductor, a loop formed by the superconductor results in magnetic flux being quantized within thy loop. The magnetic flux that is quantized in the superconductor is called an SFQ (single flux quantum). An SFQ circuit is a logic circuit that operates with magnetic flux quantum serving as information carriers. Logic "1" is represented by a slate in which a flux quantum is present in a superconducting loop including two Josephson junctions, and logic "0" is represented by a state in which a flux quantum is absent.

A number of superconducting loops, each of which is the basic structure of the SEQ circuit, arc connected together to form a ladder-type line comprised of superconductors and Josephson junctions. This is called a JTL (Josephson transmission line), and allows magnetic flux quantum to propagate. An SFQ generated in a given loop causes the switching of a next Josephson device, resulting in an SFQ being generated in the next loop. This chain reaction allows an SFQ to propagate. In this manner, various logic circuits such as flip flops or the like can be formed by use of the SFQ circuit.

In order to detect the output of a SFQ logic circuit, it is necessary to convert an SFQ pulse propagating through the SFQ circuit into a voltage pulse usable in a room temperature semiconductor logic circuit. This is achieved by a superconducting latch driver circuit.

FIG. 1 is a circuit diagram of a related-art superconducting latch driver circuit.

The superconducting latch driver circuit of FIG. 1 includes a Josephson junction 10, a resistor 11, a load inductor Lload, and a load resistor Rload. A resistor 21, a Josephson junction 22, and a resistor 23 together form one stage of the JTL, which is an example of the SFQ circuit. An inductor 15 and a Josephson junction 16 are devices for coupling the JTL and the superconducting latch driver circuit. The Josephson junction 10 has a hysteresis characteristic, and functions as a latch. An SFQ pulse having propagated through the JTL has an extremely short duration and a voltage of about 0.3 mV. In response to this short-duration pulse, the latch comprised of the Josephson junction 10 is set, thereby producing a voltage of about 2.8 mV as an output of the superconducting latch driver circuit.

[Non-patent Document 1] J. X. Przybysz and et al., "Interface Circuits for Input and Output of Gigabit per Second Data," International Superconductive Electronics Conference (ISEC'95)),8-3, p. 304-306

[Non-patent Document 2] K. K. Likharev and V. K. Semenov, "RSFQ logic/Memory Family: A New Josephson-Junction Technology for Sub-Teraherts-Clock-Frequency Digital Systems," IEEE transaction on Applied Superconductivity, Vol. 1, No. 1, March 1991, p. 3-28

In the above-mentioned superconducting latch driver circuit, there is a need to reset the latch after the latching of data as preparation for next data. To this end, it is necessary to apply an AC bias current to the Josephson junction 10. This AC bias current, however, may generate the fluctuation of ground potential, which results in the operating margin of the SFQ circuit being reduced, or ends up being mixed into an input signal. It is thus desirable to use, for an output interface, a superconducting latch driver circuit that is drivable by a DC bias current.

As an interface circuit which operates with a DC bias current, circuits based on SQUID or SFQ/DC circuits are known to date. Because an output voltage of these circuits is as small as in the range of hundreds micro bolts, however, it is difficult to drive signal lines having large characteristic impedance directly at high speed.

Accordingly, there is a need for a superconducting latch driver circuit which can generate a sufficient output voltage and is driven by a DC bias current.

SUMMARY OF THE INVENTION

It is a general object of the present invention to provide a superconducting latch driver circuit that substantially obviates one or more problems caused by the limitations and disadvantages of the related art.

Features and advantages of the present invention will be presented in the description which follows, and in part will become apparent from the description and the accompanying drawings, or may be learned by practice of the invention according to the teachings provided in the description. Objects as well as other features and advantages of the present invention will be realized and attained by a superconducting latch driver circuit particularly pointed out in the specification in such full, clear, concise, and exact terms as to enable a person having ordinary skill in the art to practice the invention.

To achieve these and other advantages in accordance with the purpose of the invention, the invention provides a circuit, including a latch circuit including a Josephson junction and configured to perform a latch operation based on a hysteresis characteristic in response to a single flux quantum, a load circuit including load inductance and load resistance and coupled to an output of the latch circuit, and a reset circuit provided between the output of the latch circuit and the load circuit and configured to reset the latch circuit a predetermined time after the latch operation by the latch circuit, wherein the Josephson junction is driven by a direct current.

In the invention described above, the self-reset function is provided to reset the latch circuit. This provides a superconducting latch driver circuit driven by a DC bias and capable of generating a sufficiently large output voltage.

According to at least one embodiment of the invention, a voltage pulse on the order of millivolts is output by use of only a direct-current bias, thereby making it possible to reduce ground ripples. It thus becomes easier to output a plurality of data items in parallel using a plurality of interface circuits. An output of the reset circuit can also be used as an electric-current pulse output. With the high drive capability and the self-reset function, the latch driver circuit of the invention may be used as a feedback driver for a superconducting double-loop sigma-delta modulator. Further, because it is possible to drive a high-resistance load of about 100 Ω, the latch driver circuit of the invention may be used not only as an output interface for an SFQ circuit but also for data transmission between SFQ circuits in a multichip module (MCM).

BRIEF DESCRIPTION OF THE DRAWINGS

Other objects and further features of the present invention will be apparent from the following detailed description when read in conjunction with the accompanying drawings, in which:

FIGS. 18A through 18D are diagrams showing an example of a circuit layout and an example of the results of an experiment according to the second aspect of the invention;

DESCRIPTION OF THE PREFERRED EMBODIMENTS

In the following, embodiments of the present invention will be described with reference to the accompanying drawings.

A superconducting latch driver circuit according to the invention includes at least one latch circuit driven by a direct-current (DC) bias, including a Josephson junction having a hysteresis characteristic, and further includes a reset circuit comprised of a series connection of a resistor and an inductor in addition to the load. The resistance of the resistor is set smaller than (gap voltage Vg)/(critical current Ic) in respect of the Josephson junction and also smaller than the load resistance. Further, the inductance of the inductor is set larger than the load inductance. Immediately after an SFQ pulse arrives, almost no current flows through the reset circuit, and the latch circuit including the Josephson junction performs a latch operation. As a time roughly equal to the time constant L/R of the reset circuit passes, an output current flows into the reset circuit, resulting in a decrease in the amount of current flowing into the Josephson junction.

This resets the latch circuit. In this manner, a self-reset function is provided.

Figure 1:
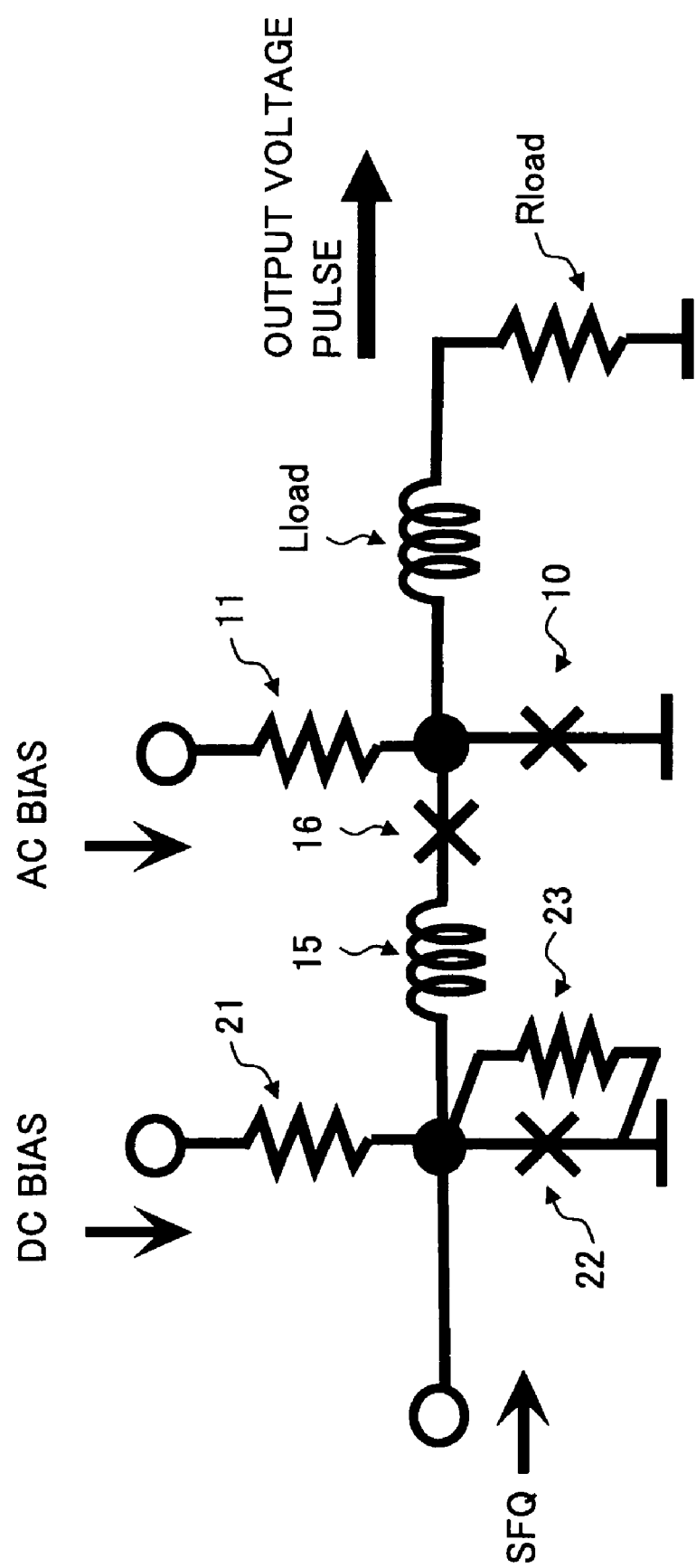
FIG. 1 is a circuit diagram of a related-art superconducting latch driver circuit.
Figure 2:
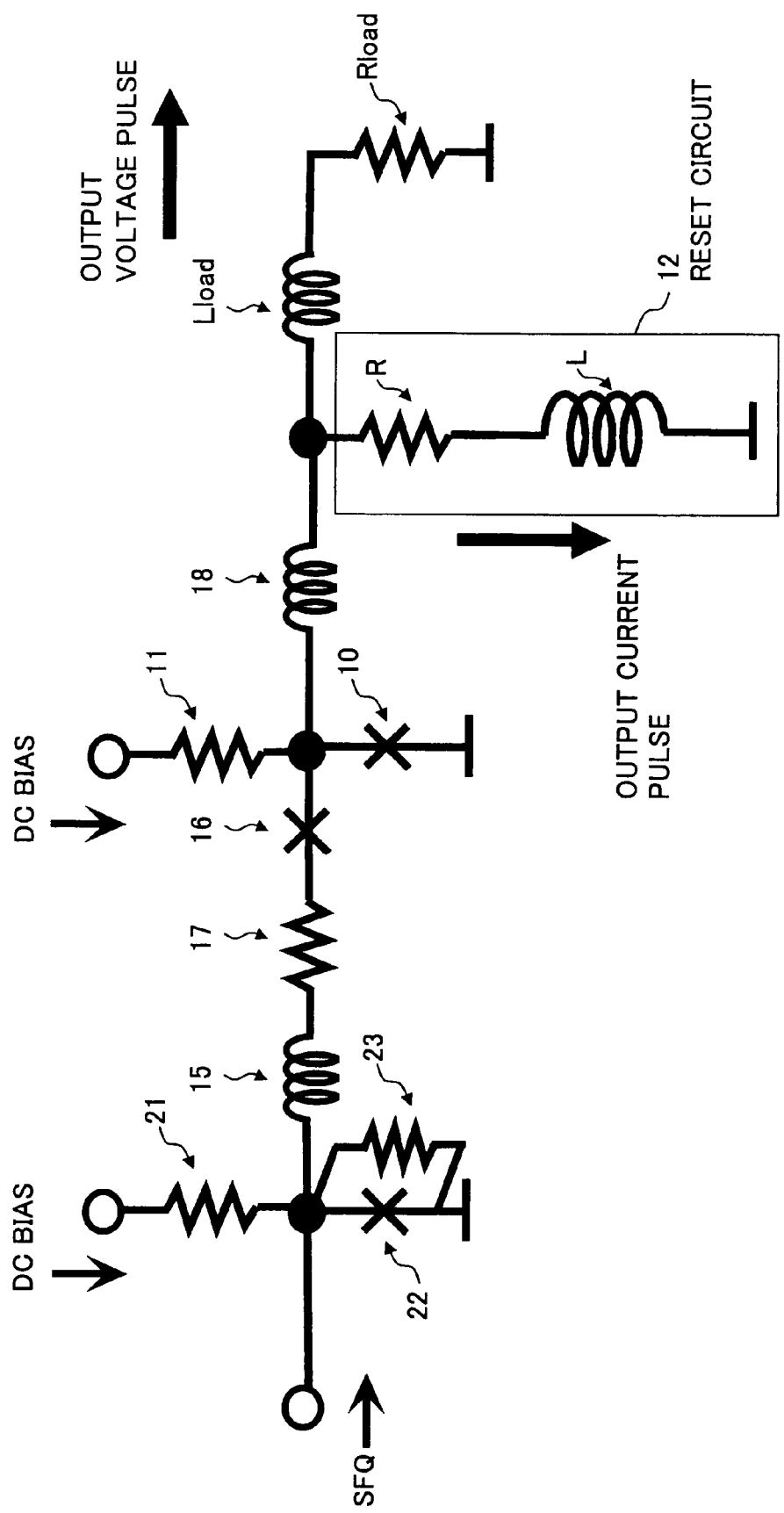
FIG. 2 is a circuit diagram showing an example of the construction of a superconducting latch driver circuit according to the invention.

FIG. 2 is a circuit diagram showing an example of the construction of the superconducting latch driver circuit according to the invention.

The superconducting latch driver circuit of the invention includes a Josephson junction 10, a resistor 11, a reset circuit 12 comprised of a resistor R and an inductor L, a load inductor Lload, and a load resistor Rload. This superconducting latch driver circuit is provided with a DC bias. A resistor 21, a Josephson junction 22, and a resistor 23 together form one stage of the JTL, which is an example of the SFQ circuit. An inductor 15 and a Josephson junction 16 are devices for coupling the JTL and the superconducting latch driver circuit. An inductor 18 is a device for coupling the larch circuit portion comprised of the Josephson junction 10 with the reset circuit 12.

In this construction, the Josephson junction 10 itself has a hysteresis characteristic, and functions as a latch. An SFQ pulse having propagated through the JTL has an extremely short duration and a voltage of about 0.3 mV. In response to this short-duration pulse, the latch comprised of the Josephson junction 10 is set, thereby producing a voltage of about 2.8 mV as an output of the superconducting latch driver circuit.

In this superconducting latch driver circuit, there is a need to reset the latch after the latching of data as preparation for next data. To this end, the reset circuit 12 comprised of a series connection of the resistor R and the inductor L is provided. The resistance R and the inductance L are set so as to satisfy the following.

$R < Vg/Ic$ $R << Rload$ $L >> Lload$ $L/R >> Lload/Rload$

Namely, the resistance R is set smaller than (gap voltage Vg)/(critical current Ic) in respect of the Josephson junction 10 and also smaller than the load resistor Rload, and the inductance L is set larger than the load inductance Lload. With this provision, immediately after an SFQ pulse arrives, almost no current flows through the reset circuit 12, and the latch circuit including the Josephson junction 10 performs a latch operation. As a time roughly equal to the time constant L/R of the reset circuit 12 passes, an output current flows into the reset circuit 12, resulting in a decrease in the amount of current flowing into the Josephson junction. This resets the latch circuit. In this manner, a self-reset function is provided. The adjustment of the resistance R and the inductance L makes it possible to produce a desired pulse width.

Figure 3:
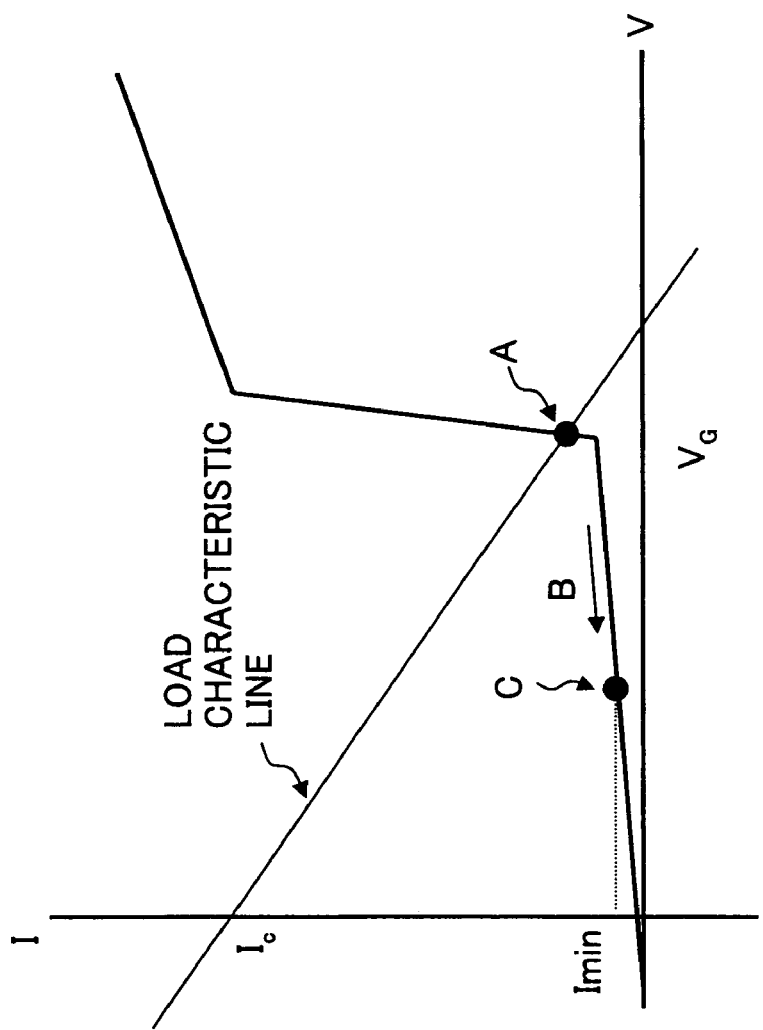
FIG. 3 is a diagram showing hysteresis in the current-voltage characteristics of a Josephson junction.

FIG. 3 is a diagram showing the hysteresis characteristic of the current-voltage characteristic of the Josephson junction 10.

As an SFQ pulse arrives from the JTL in the circuit of FIG. 2, an electric current I that flows through the Josephson junction 10 increases along the vertical axis of the diagram of FIG. 3 while keeping a voltage V at zero. When the current I reaches the critical current Ic, a transition occurs, resulting in the voltage V being at the gap voltage Vg. At this point of time, the relationship between the current I and the voltage V is represented by the position of a point A illustrated in FIG. 3. This point A corresponds to an intersection of the hysteresis characteristic of the Josephson junction 10 and the characteristic line of the load.

When a transition to the point A occurs, almost no current runs through the reset circuit 12, so that the load of the reset circuit is not appearing yet. Thus, the characteristic line of the load is determined by the load inductance Lload and the load resistance Rload. As time passes, thereafter, the electric current that runs through the reset circuit 12 increases. This results in an effect of the resistor R and inductor L of the reset circuit 12 being gradually appearing as the load. The slope of the load characteristic line changes in response, so that the current-and-voltage relationship moves from the point A in a direction shown by an arrow B. As this move reaches a point C, the current I achieves its minimum current Imin, followed by a transition along a dotted line, resulting in the voltage V being zero.

Through the operations described above, the resetting of the latch circuit is achieved. The present invention, thus, provides a superconducting latch driver circuit driven by a DC bias that is provided with a reset function and can produce a sufficient output voltage.

Figure 4:
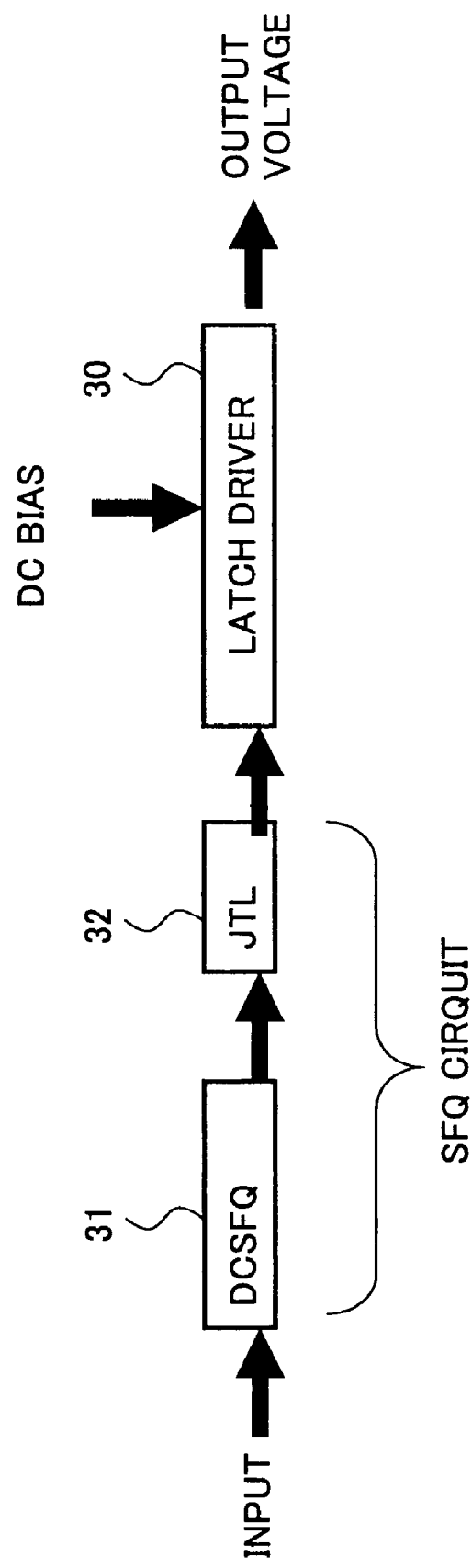
FIG. 4 is a diagram showing an embodiment of a system to which the superconducting latch driver circuit of the invention is applied.

FIG. 4 is a diagram showing an embodiment of a system to which the superconducting latch driver circuit of the invention is applied.

The system of FIG. 4 includes a latch driver 30 which is the superconducting latch driver circuit, a DCSFQ circuit 31, and a JTL 32. The DCSFQ circuit 31 serves to generate an SFQ pulse in response to an input of a logic level from a room temperature semiconductor circuit. The generated SFQ pulse propagates through the JTL 32, and arrives at the latch driver 30. The latch driver 30 is the superconducting latch driver circuit shown in FIG. 2, for example, and performs a latch operation in response to the incoming SFQ pulse, thereby outputting a signal having a logic level detectable by a room temperature semiconductor circuit.

Simulation was conducted with respect to a circuit in which the superconducting latch driver circuit of the invention was coupled to a simple SFQ circuit, on an assumption that a superconducting interface circuit would be manufactured based on the thin-film integrated circuit technology using a Nb (niobium) superconductor. In the case of a latch driver having a single junction stage, an output signal sequence having an identical waveform to the input signal sequence was obtained in which the amplitude of an output voltage was amplified to 1.8 mV at an operating frequency of 5 GHz.

Figure 5:
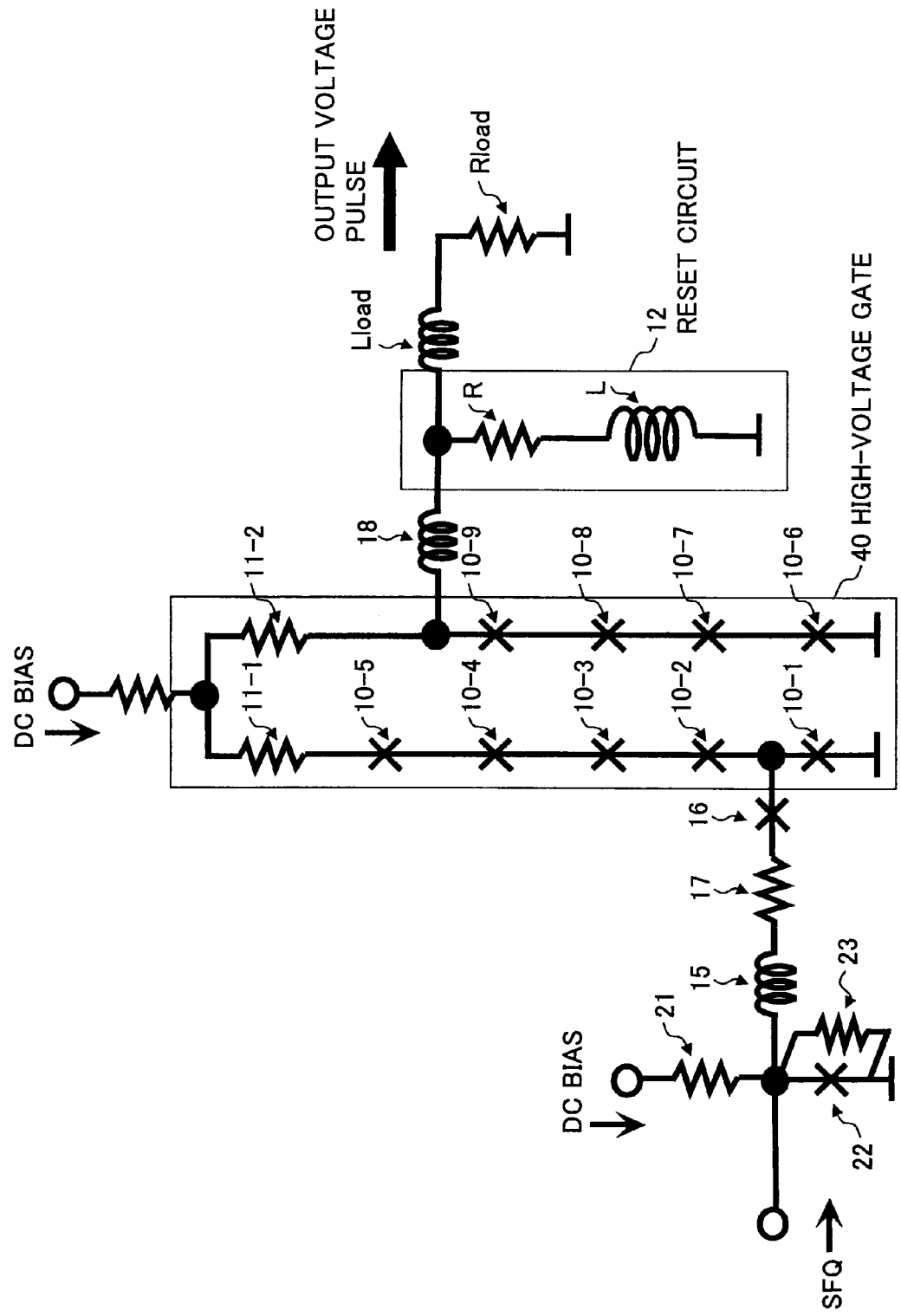
FIG. 5 is a circuit diagram showing another example of the construction of the superconducting latch driver circuit according to the invention.

FIG. 5 is a circuit diagram showing another example of the construction of the superconducting latch driver circuit according to the invention. In FIG. 5, the same elements as those of FIG. 2 are referred to by the same reference numbers or symbols, and a description thereof will be omitted.

The construction of FIG. 5 differs from the construction of FIG. 2 in the portion of the latch circuit. In the construction of FIG. 5, Josephson junctions 10-1 through 10-9 having the hysteresis characteristic are connected, forming multiple stages. The Josephson junctions 10-1 through 10-5 are connected in multiple stages, to which a DC bias current is applied through a resistor 11-1. In parallel to this multiple stage connection, the Josephson junctions 10-6 through 10-9 are connected in multiple stages, to which a DC bias current is applied through a resistor 11-2. This provides a high-voltage gate 40 having four stages. Simulation was conducted with respect to this construction with a simple SFQ circuit coupled thereto as shown in FIG. 4, and an amplitude of 5 mV was obtained for an output voltage at an operating frequency of 5 GHz.

Figure 6:
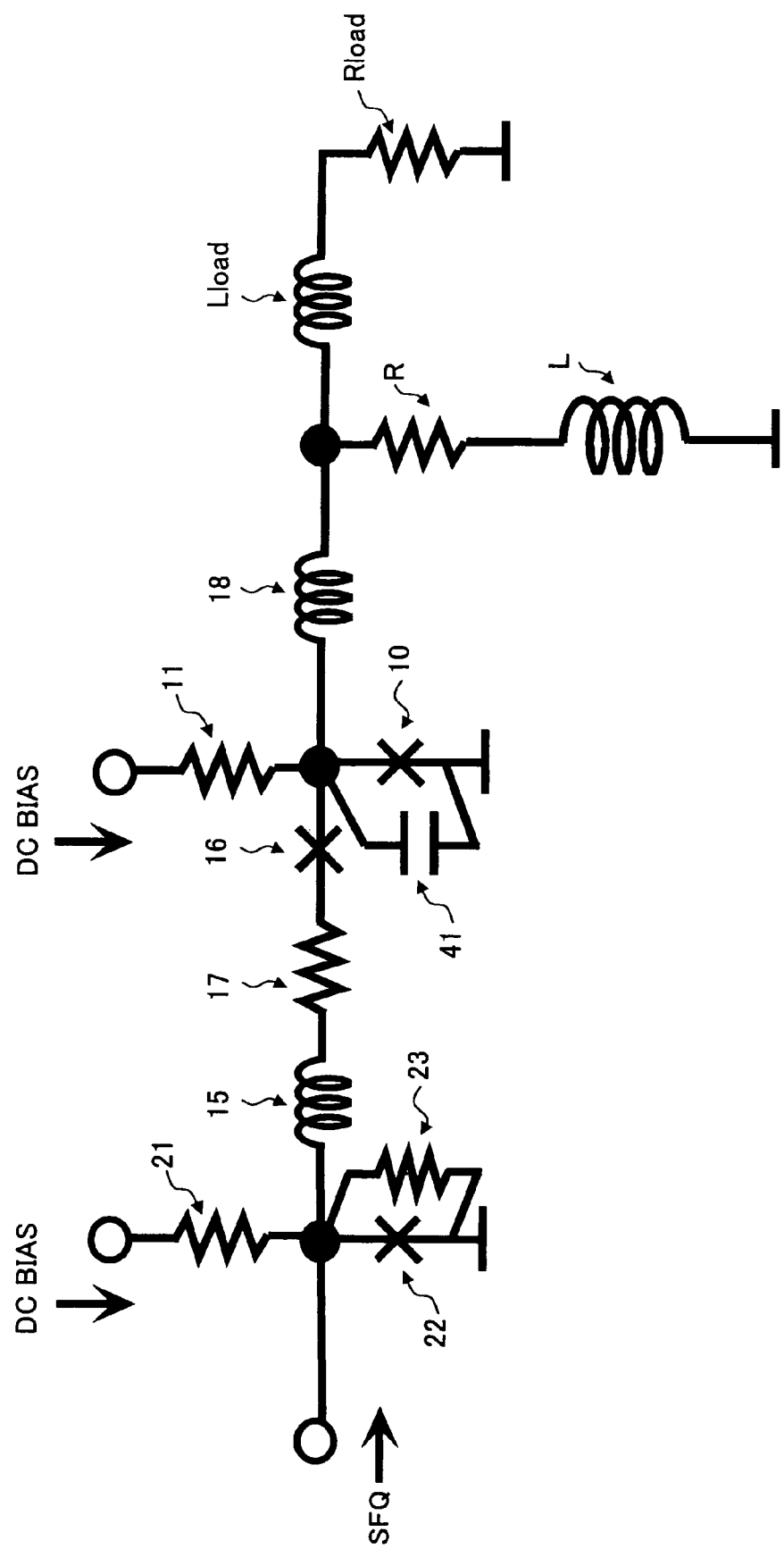
FIG. 6 is a circuit diagram showing another example of the construction of the superconducting latch driver circuit according to the invention.

FIG. 6 is a circuit diagram showing another example of the construction of the superconducting latch driver circuit according to the invention. In FIG. 6, elements having the same circuit functions as those of FIG. 2 are referred to by the same reference numbers or symbols, and a description thereof will be omitted. In the construction of FIG. 6, it is assumed that a superconducting interface circuit is produced by use of the thin-film integrated circuit technology using YBCO-based high-temperature superconductor, for example, and is operated at a temperature of 30 K.

The circuit of FIG. 6 differs from the circuit construction of FIG. 2 in the portion of the latch circuit. In the construction of FIG. 2, a superconducting interface based on the thin-film integrated circuit technology using Nb superconductor is assumed, and the Josephson junction 10 has the hysteresis characteristic that is shown as current-voltage characteristics in FIG. 3. In the construction of FIG. 6, on the other hand, a superconducting interface circuit based on the thin-film integrated circuit technology using YBCO-based high-temperature superconductor is assumed, and the Josephson junction 10 of itself does not possess the hysteresis characteristic. A shunt capacitance 41 is thus coupled in parallel to the Josephson junction 10 to provide the hysteresis characteristic, thereby forming a latch circuit.

According to simulation, in the case of a latch driver circuit having a single Josephson-junction stage, an output voltage of about 0.4 mV was obtained at an operating frequency of 5 GHz.

Figure 7:
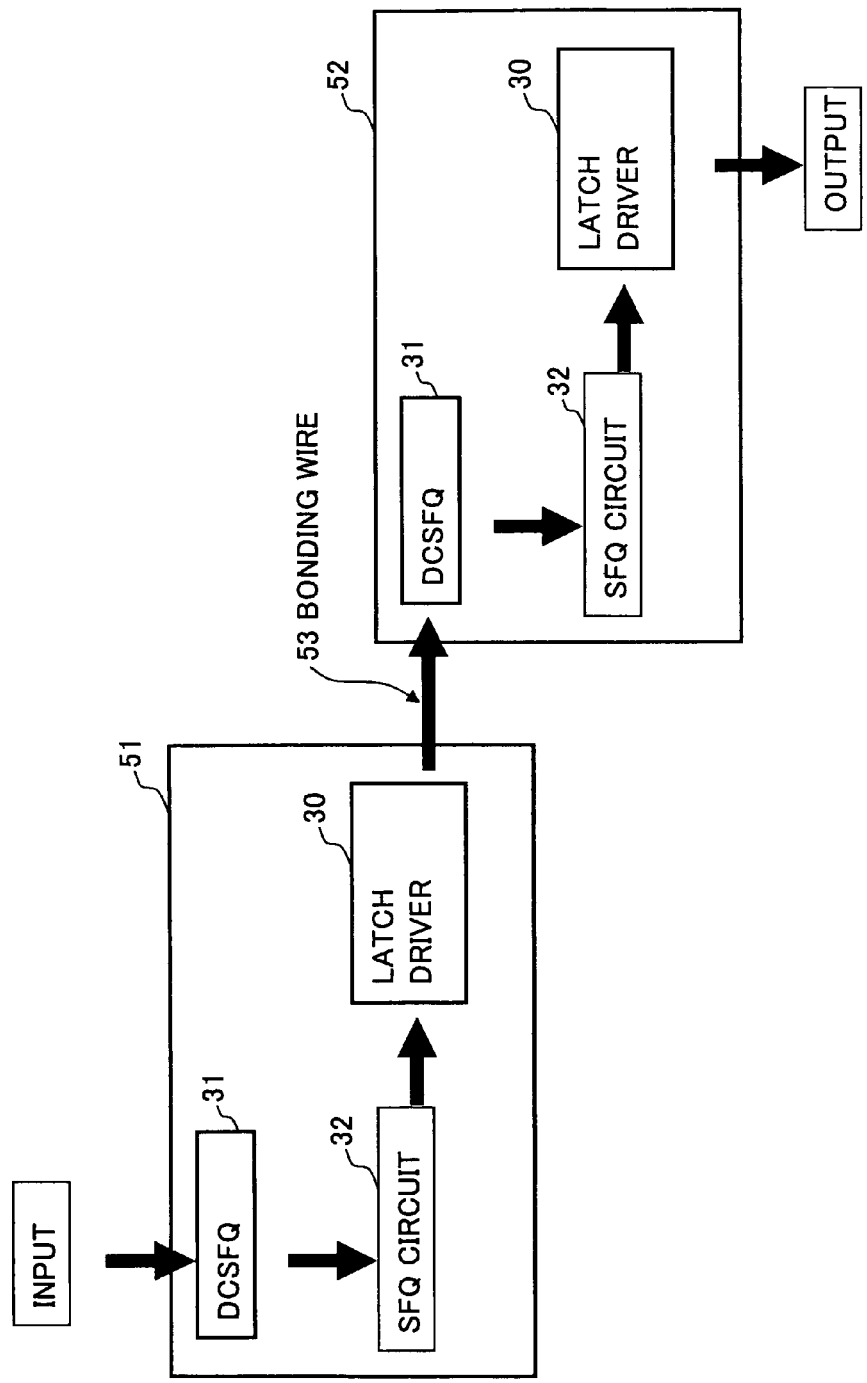
FIG. 7 is a block diagram showing another embodiment of the system to which the superconducting latch driver circuit of the invention is applied.

FIG. 7 is a block diagram showing another embodiment of the system to which the superconducting latch driver circuit of the invention is applied. In FIG. 7, the same elements as those of FIG. 4 are referred to by the same numbers or symbols, and a description thereof will be omitted.

In FIG. 7, a chip 52 comprised of the latch driver 30, the DCSFQ circuit 31, and the JTL 32 is coupled through a bonding wire 53 to a chip 51 similarly comprised of the latch driver 30, the DCSFQ circuit 31, and the JTL 32. This provision makes it possible to transmit data between SFQ circuits implemented on a plurality of chips forming a multi-chip module (MCM) by use of the latch driver circuit of the invention as a superconducting interface circuit.

Figure 8:
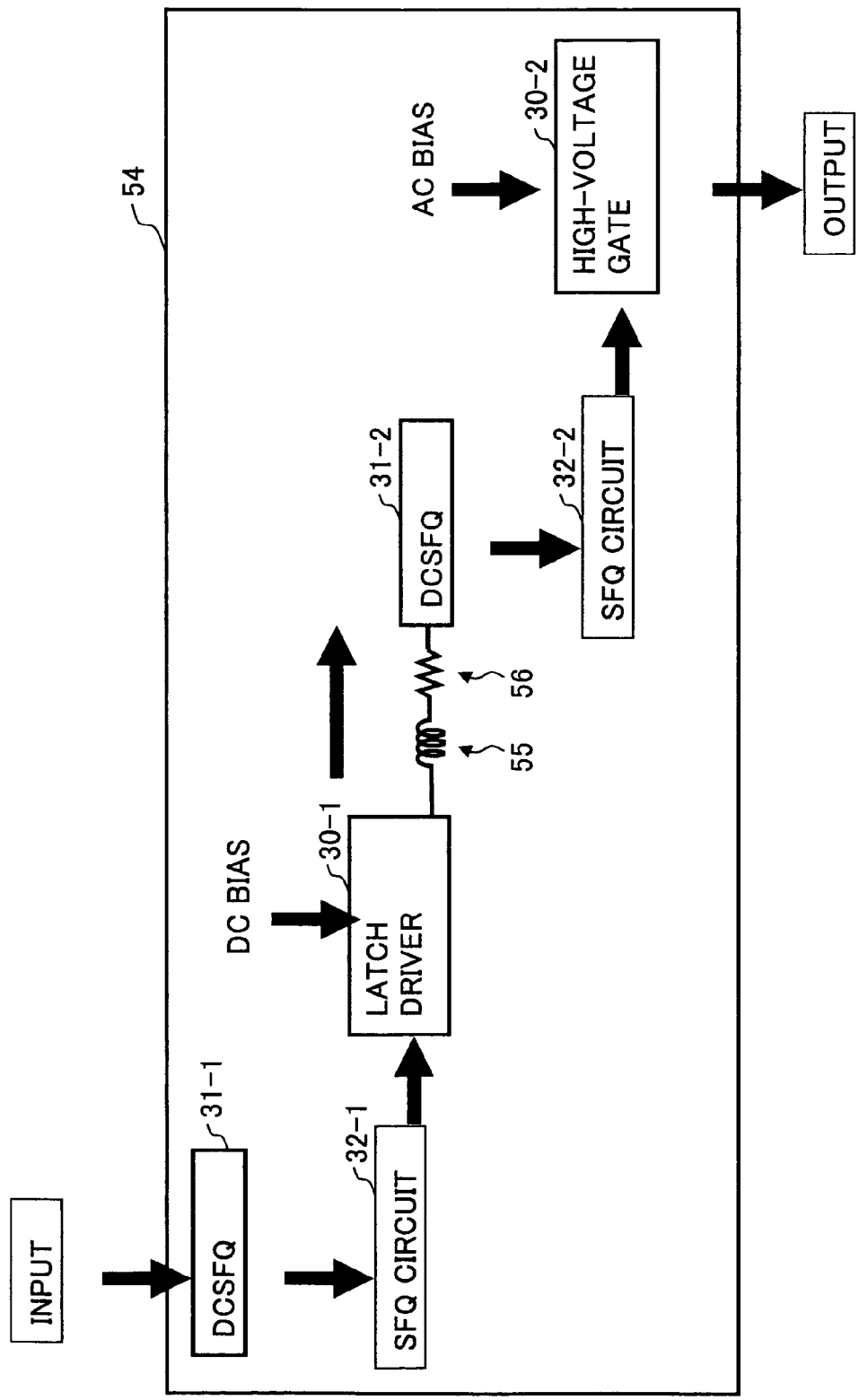
FIG. 8 is a diagram showing the construction of a circuit produced by use of the Nb-system-superconductivity thin-film integrated circuit technology based on the premise of the construction of FIG. 7.

FIG. 8 is a diagram showing the construction of a circuit produced by use of the Nb-superconductor thin-film integrated circuit technology based on the premise of the construction of FIG. 7.

In FIG. 8, a latch driver 30-1, DCSFQ 31-1, and JTL 32-1 which correspond to the latch driver 30, DCSFQ circuit 31, and JTL 32 on the data-transmission-side chip 51 of FIG. 7, as well as a latch driver 30-2, DCSFQ 31-2, and JTL 32-2 which correspond to the latch driver 30, DCSFQ circuit 31, and JTL 32 on the data-reception-side chip 52 of FIG. 7 are provided on a single chip 54. In the MCM construction of FIG. 7, the bonding wire 53 provides an inter-chip coupling. In the emulating circuit of FIG. 8, a strip line including a resistance 56 and an inductance 55 emulates a bonding wire, thereby imitating inter-chip data transmission.

The DCSFQ 31-2 on the data-reception side is driven by an electric current pulse output from the latch driver 30-1 of the data-transmission side. The resistance 56 and the inductance 55 for emulating the inter-chip bonding wire were assumed to be 2 ohms and 40 pH, respectively. It was confirmed that digital data "1011" was correctly transmitted at an operating frequency of 1 GHz. Although 1 GHz was used in testing because of the limitations of measuring devices, a proper operation at 10 GHz could be achieved according to a projection based on the switching speed of latch junction.

Figure 9:
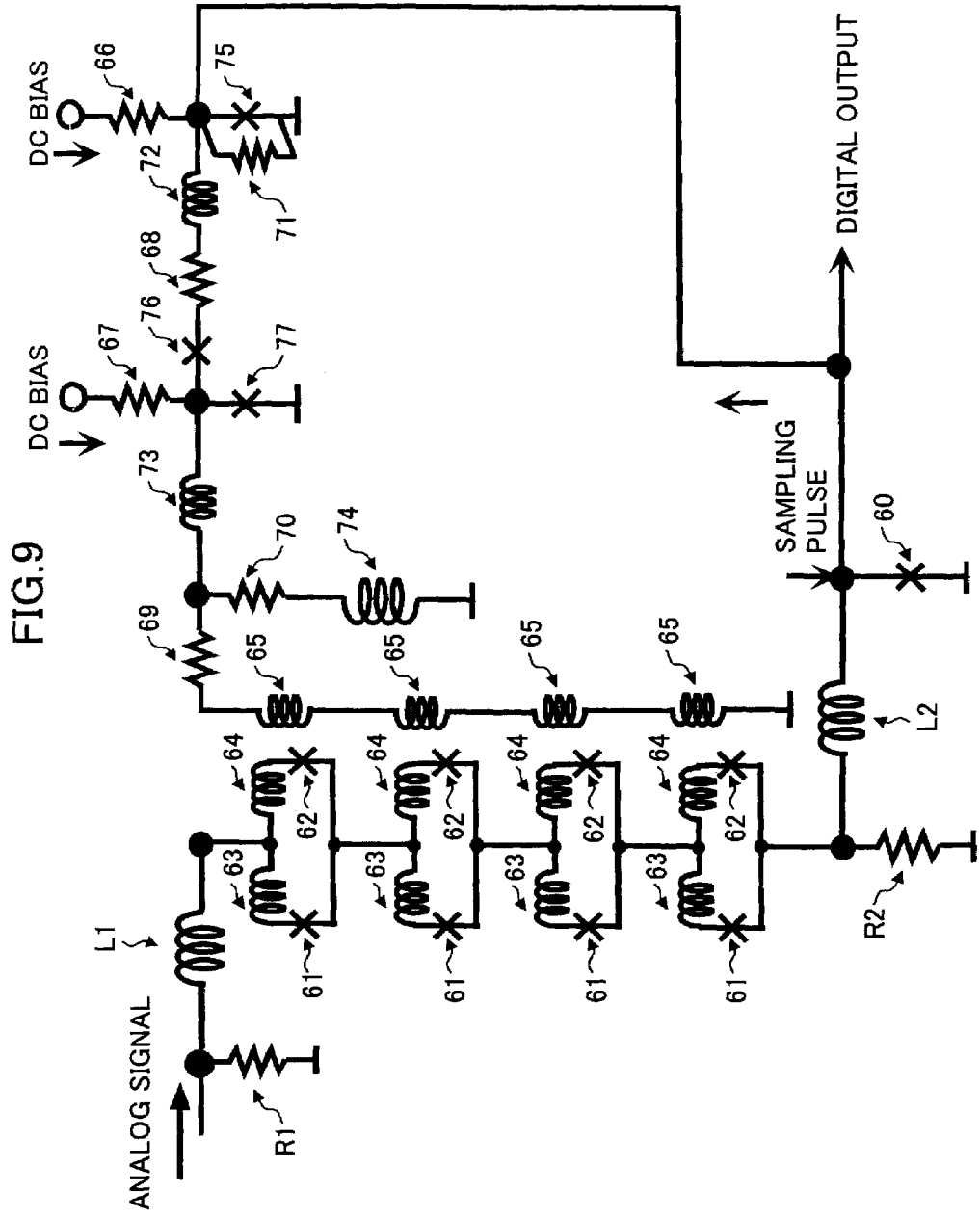
FIG. 9 is a drawing showing a further embodiment of a system to which the superconducting latch driver circuit of the invention is applied.

FIG. 9 is a drawing showing a further embodiment of a system to which the superconducting latch driver circuit of the invention is applied. In FIG. 9, the same elements as those of FIG. 4 are referred to by the same numbers or symbols, and a description thereof will be omitted.

The circuit of FIG. 9 is a superconducting-double-loop sigma-delta modulator. An integrator (low-pass filter) comprised of a resistor R2 and an inductor L2 serves to integrate an analog signal, and a Josephson junction 60 serving as a comparator compares the integrated value with a threshold value. The result of comparison is a digital output having a pulse-density modulated waveform indicative of an input analog signal value. This digital output is decimated by a digital filter (not shown) provided at a subsequent stage, thereby providing a sigma-delta AD converter. In this construction, an SFQ (single flux quantum) generated by the Josephson junction 60 in conjunction with the comparison process is returned to the inductor L1 to reduce the output of the integrator by a constant amount, thereby achieving a second feedback of the double-loop sigma-delta modulator.

In the construction of FIG. 9, furthermore, a circuit portion comprised of Josephson junctions 61 and 62 and inductors 63 and 64 is connected one over another to form multiple stages (four stages in the illustration), and this multi-stage coupling circuit is driven magnetically by a plurality of inductors 65. The plurality of inductors 65 are driven by feedback from the Josephson junction 60. With this provision, the double-loop sigma-delta modulator having two stages of integrators is constructed, which achieves high resolution and high speed.

The feedback path includes resistors 66 through 71, inductors 72 through 74, and Josephson junctions 75 through 77, being a feedback path including a JTL and a superconducting latch driver circuit. That is, the superconducting latch driver circuit of the invention is employed as a drive circuit for outputting an electric current pulse that magnetically drives the feedback driver circuit, thereby attaining a sufficient drive capability. The values of the resistor 70 and inductor 74 are adjusted to generate an electric current pulse having a short duration.

It should be noted that the circuit shown in FIG. 9 includes a SQUID (superconducting quantum interference device) comprised of the Josephson junctions 61 and 62 and the inductors 63 and 64, and that the multi-stage structure of SQUID circuits is driven by the load inductors (the plurality of inductors 65) of the superconducting latch driver circuit of the present invention.

Figure 10A:
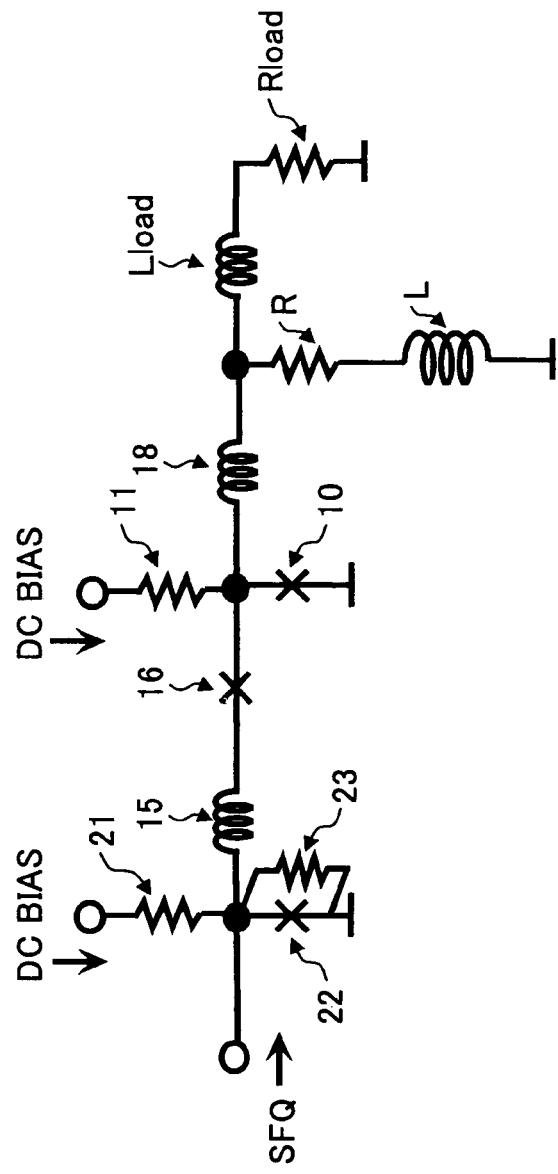
FIGS. 10A and 10B are circuit diagrams showing another example of the construction of the superconducting latch driver circuit according to the invention.
Figure 10B:
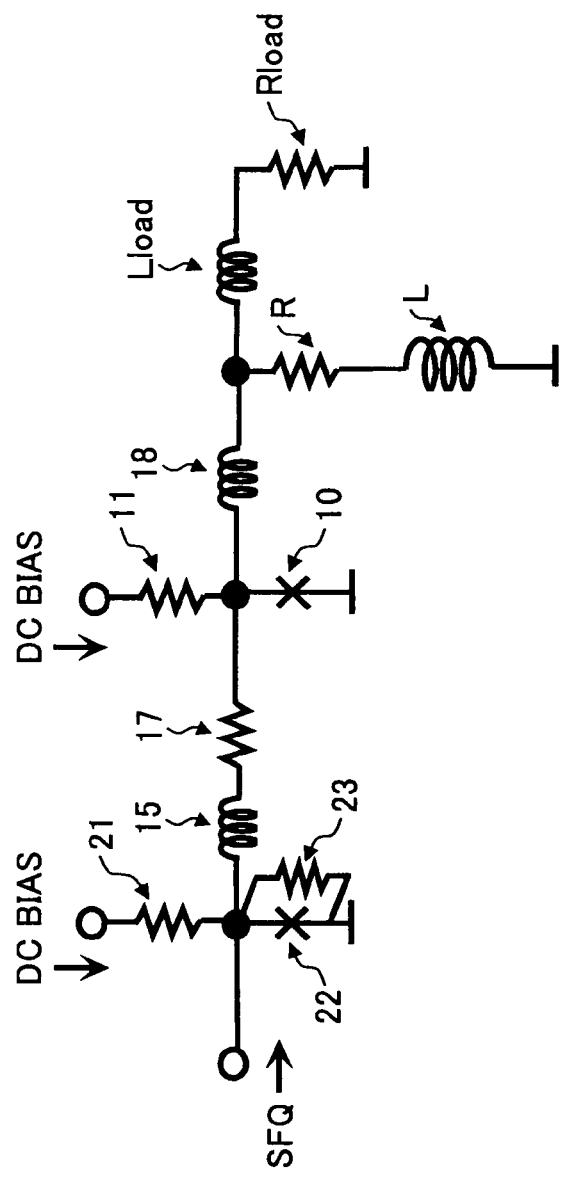

FIGS. 10A and 10B are circuit diagrams showing another example of the construction of the superconducting latch driver circuit according to the invention. In FIGS. 10A and 10B, elements having the same circuit functions as those of FIG. 2 are referred to by the same reference numbers or symbols, and a description thereof will be omitted.

The circuit of FIGS. 10A and 10B differs from the circuit construction of FIG. 2 in a circuit device used at a junction between the JTL and the latch circuit. In FIG. 10A, a Josephson junction 16 for the isolation purpose is provided in series between the latch driver circuit of the invention and the SFQ circuit situated at the preceding stage. While the latch circuit is in a latched state, its voltage fluctuates. This voltage fluctuation may cause malfunction if it propagates to the SFQ circuit situated at the preceding stage. With the Josephson junction 16 for the isolation purpose, the propagation of such voltage fluctuation can properly be suppressed.

The same effect is brought about by a construction in which a resistor 17 is provided in series between the SFQ circuit of the preceding stage and the latch driver circuit of the invention as shown in FIG. 10B.

Moreover, both the Josephson junction 16 and the resistor 17 may as well be provided. The embodiment shown in FIG. 2 is directed to such a configuration as both the Josephson junction 16 and the resistor 17 are provided.

Although it is a JTL that is shown as a circuit provided at the preceding stage, a buffer gate or other SFQ circuits may as well be used. A superconducting logic circuit provided at the stage preceding the superconducting latch driver circuit of the invention is not limited to an SFQ logic circuit, but may as well be a logic circuit comprised of latch junctions.

Figure 11:
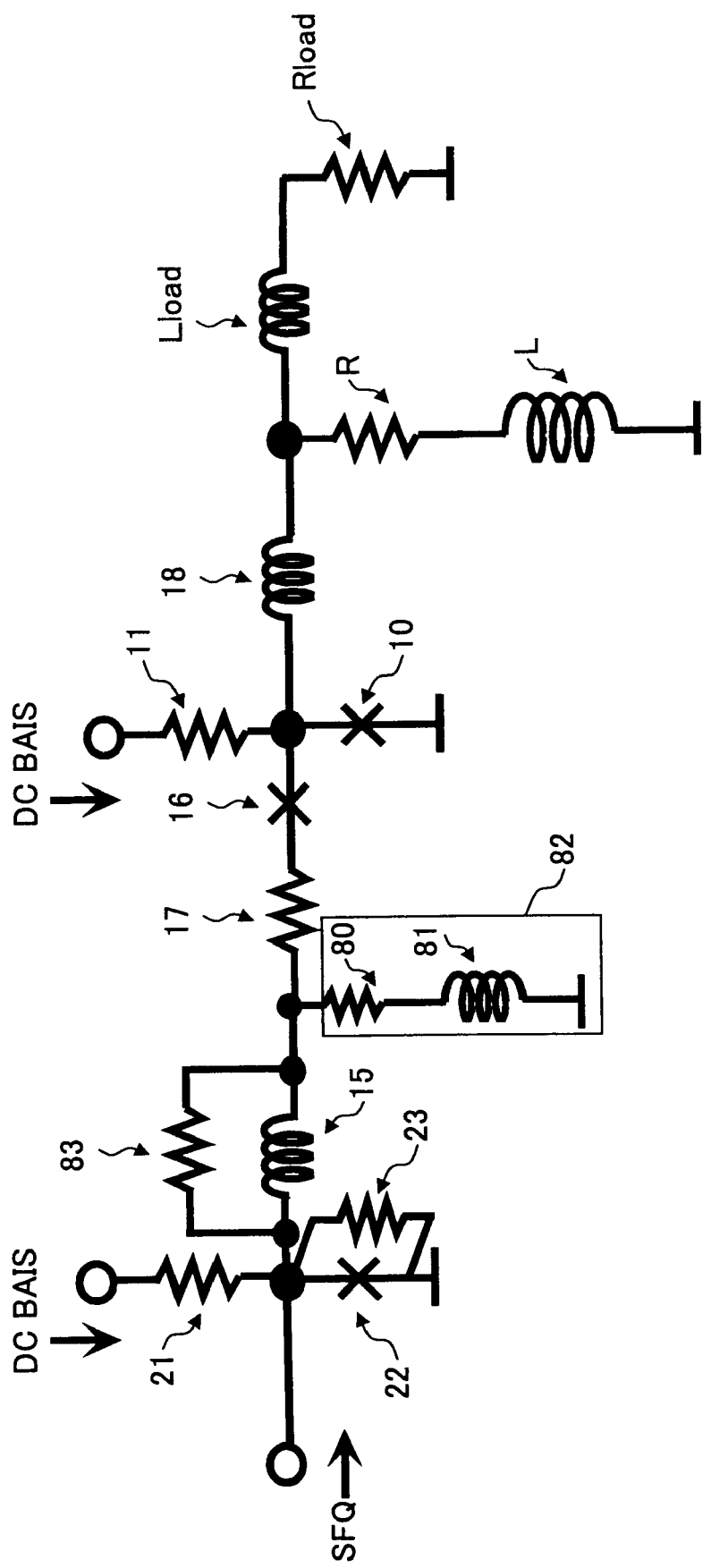
FIG. 11 is a circuit diagram showing another example of the construction of the superconducting latch driver circuit according to the invention.

FIG. 11 is a circuit diagram showing another example of the construction of the superconducting latch driver circuit according to the invention. In FIG. 11, elements having the same circuit functions as those of FIG. 2 are referred to by the same reference numbers or symbols, and a description thereof will be omitted.

In the construction shown in FIG. 11, a node A situated between the SFQ circuit of the preceding stage and the latch driver circuit of the invention is coupled to the ground via a dumping network 82 comprised of a resistor 80 and an inductor 81. Such construction brings about an effect that suppresses the propagation of voltage fluctuation as in the case of the construction shown in FIG. 10. Further, as shown in FIG. 11, a dumping resistor 83 may be provided in parallel to the inductor 15 that couples between the SFQ circuit of the preceding stage and the latch driver circuit of the invention. This makes it possible to increase an operating margin and also to suppress an effect on the SFQ circuit of the preceding stage.

In the following, a second aspect of the invention will be described.

As a macroscopic quantum effect of superconductor, a loop formed by superconductor results in magnetic flux being quantized within the loop. The magnetic flux that is quantized in superconductor is called an SFQ (single flux quantum). An SFQ circuit is a logic circuit that operates with magnetic flux quantum serving as information carriers. Logic "1" is represented by a state in which a flux quantum is present in a superconducting loop including two Josephson junctions, and logic "0" is represented by a state in which a flux quantum is absent.

A number of superconducting loops, each of which is the basic structure of the SFQ circuit, are connected together to form a ladder-type line comprised of superconductors and Josephson junctions. This is called a JTL (Josephson transmission line), and allows magnetic flux quantum to propagate. An SFQ generated in a given loop causes the switching of a next Josephson device, resulting in an SFQ being generated in the next loop. This chain reaction allows an SFQ to propagate. In this manner, various logic circuits such as flip flops or the like can be formed by use of the SFQ circuit. It is expected that such SFQ circuits are applied to various digital processing circuits including those with analog elements such as a superconducting sampler for measuring a high-speed signal, an A/D converter for use for high-speed signals and small-level signals, etc.

In the superconducting SFQ circuit, a pulse having an extremely short duration propagates as an information carrier, so that it is necessary to convert an SFQ pulse having such a short duration into a voltage pulse detectable in a room temperature semiconductor logic circuit. As such an output circuit, a latch circuit or a high-voltage driver gate driven by an AC bias is used in many cases.

In superconducting circuits, a superconducting thin-film layer called a grand plane is provided at the bottom layer or at the top layer, thereby reducing the inductance of superconducting wiring and also reducing crosstalk between adjacent circuits within the same chip. Such a ground plane layer is generally provided across the entire surface of circuitry.

Since a ground plane layer is provided all over the surface of circuitry, the use of an AC bias in an output circuit or the like causes the ground potential to fluctuate due to the function of parasitic inductance or parasitic capacitance. This fluctuation undesirably affects the operation of a nearby superconducting SFQ circuit.

Accordingly, there is a need for a superconducting SFQ circuit where the fluctuation of the ground potential with respect to one part of the superconducting SFQ circuit will not affect the operation of another part of the superconducting SFQ circuit.

In the present invention, one or more stages of separation-purpose superconducting SFQ circuits for conducting a SFQ pulse and for isolating ground fluctuation are provided as a coupling between a first superconducting SFQ circuit block and a second superconducting SFQ circuit block. The first superconducting SFQ circuit block, each stage of the separation-purpose superconducting SFQ circuits, and the second superconducting SFQ circuit block are each provided with respective ground planes, which are coupled via a narrow ground line having an inductance of a few pH or more. With this provision, an AC signal is prevented from flowing from one to the other between the first superconducting SFQ circuit block and the second superconducting SFQ circuit block.

Figure 12:
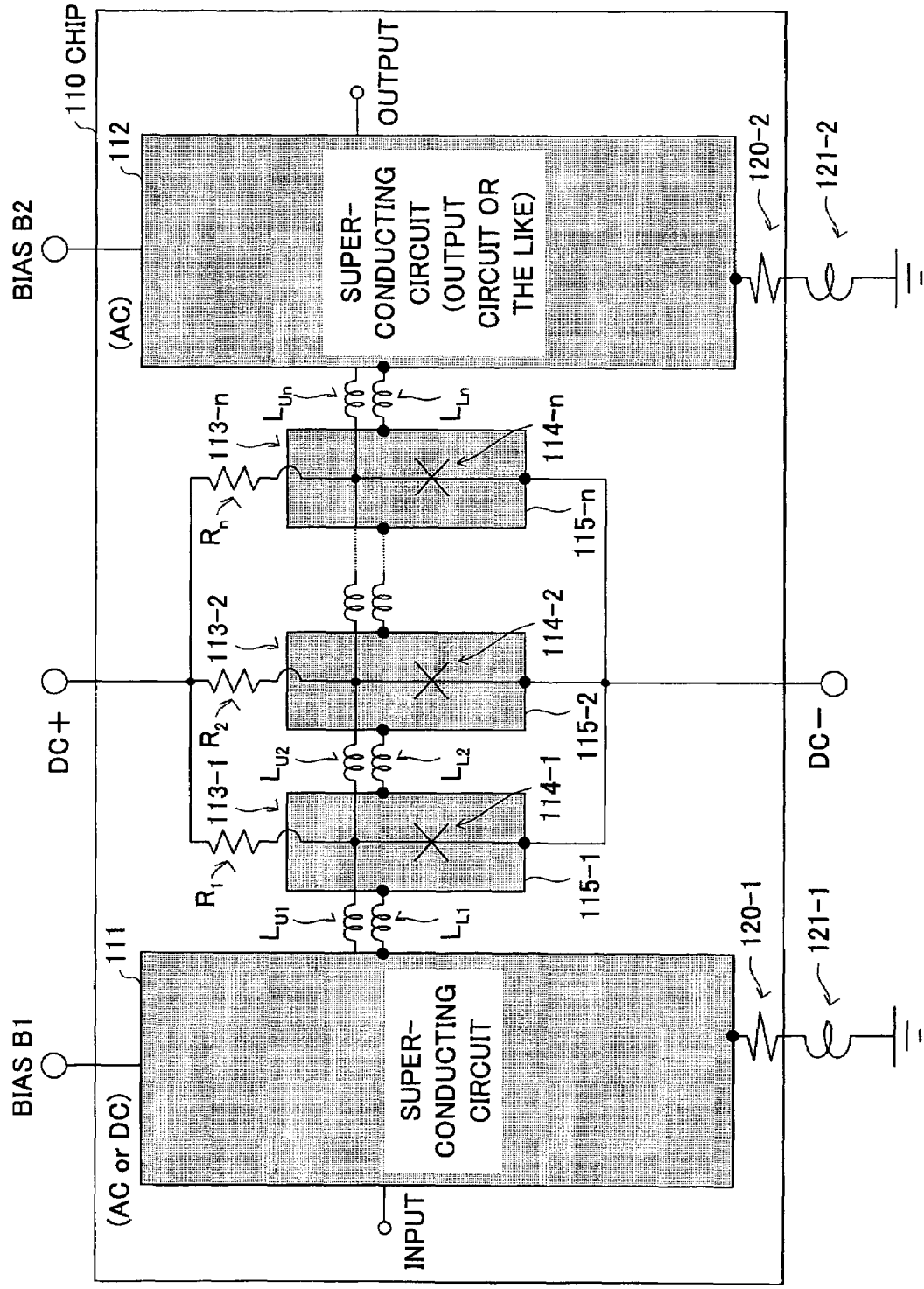
FIG. 12 is an illustrative drawing for explaining the principle of the invention.

FIG. 12 is an illustrative drawing for explaining the principle of the invention.

In FIG. 12, a chip 110 includes a superconducting circuit 111, a superconducting circuit 112, and n stages of superconducting SFQ circuits 113-1 through 113-$n$. The superconducting circuit 111 and the superconducting circuit 112 are coupled to each other via the superconducting SFQ circuits 113-1 through 113-$n$, through which an SFQ (single flux quantum) pulse propagates. The superconducting circuit 111 is coupled to a bias B1 and the ground potential, and the superconducting circuit 12 is coupled to a bias B2 and the ground potential. The biases B1 and B2 may be either an AC bias or a DC bias. Because of the object of the invention that is to suppress an effect of an AC bias, at least one of the biases B1 and B2 is supposed to be an AC bias.

The superconducting SFQ circuits 113-1 through 113-$n$ make up a Josephson transmission line (JTL), for example, and are coupled to DC biases DC+ and DC−. In FIG. 12, each stage of a superconducting SFQ circuit 113-$x$ ($x=1, 2, \ldots, n$) is coupled to the DC bias DC+ through a resistor $R_x$, and is directly coupled to the DC bias DC−. This is not a limiting example, and couplings may be provided via resistance and/or inductance on either side of DC+ and DC−, as will be described in connection with a subsequent embodiment. Alternatively, coupling to the biases may be provided through other circuitry. In FIG. 12, the ground of the superconducting circuit 111, the ground of the superconducting circuit 112, and the minus-side DC bias DC− of the superconducting SFQ circuits 113-1 through 113-$n$ are set to a common ground potential. It should be noted that resistance 120-1 and inductance 121-1 represent parasitic resistance and inductance between the superconducting circuit 111 and the ground potential, and resistance 120-2 and inductance 121-2 represent parasitic resistance and inductance between the superconducting circuit 112 and the ground potential.

The superconducting SFQ circuit 113-x includes a Josephson junction 114-x, a ground plane 115-x, and inductances LUx and LLx for providing connections with adjoining circuits. The inductance LUx is implemented by use of an ordinary wiring layer, and the inductance LLx is provided such as to connect adjacent grounds together in a ground plane layer or another layer. The inductances LUx and LLx are implemented as crossconnects having such a thin width as to provide an inductance of a few pH or more.

The higher the frequency, the greater the impedance of inductance becomes. As the frequency increases, thus, the separation of grounds between adjacent circuits becomes increasingly strong. That is, even if the ground potential of the superconducting circuit 112 fluctuates due to an alternate (AC) bias current supplied to the superconducting circuit 112, such fluctuation is absorbed by the inductances LL1 through LLn, and the ground potential of the superconducting circuit 111 is hardly affected.

The JTL used for the propagation of SFQ signals has a large operating margin, and, thus, is not susceptible to the fluctuation of the ground potential. If a delay time from an input to an output is not a major issue, in principle, the number (n) of stages of the superconducting SFQ circuits 113-1 through 113-n may be increased as much as necessary to achieve a sufficient absorption of ground fluctuation.

In order to allow an SFQ pulse to propagate, the product of the inductance L of the superconducting loop serving as the basic structure of an SFQ circuit and the critical current Ic of the Josephson junction needs to be smaller than the value f0 of magnetic flux quantum, and preferably smaller than f0/2. Here, f0 is 2×10−15 weber. If the critical current Ic is set to 0.1 mA, for example, the inductance L needs to be set to 20 pH, and preferably to 10 pH or less. Within a range that satisfies those requirements, the upper limits of the inductances LUx and LLx are determined. As for the lower limits, an inductance that is not sufficiently zero suffices. In practice, the use of any wiring for providing inductance will always result in an inductance of at least a few pH. It is thus almost impossible to create an inductance of only 1 pH. In practice, therefore, inductance may be set to a value ranging from a few pH to about 10 pH.

In the following, embodiments of the invention will be described with reference to the accompanying drawings.

Figure 13:
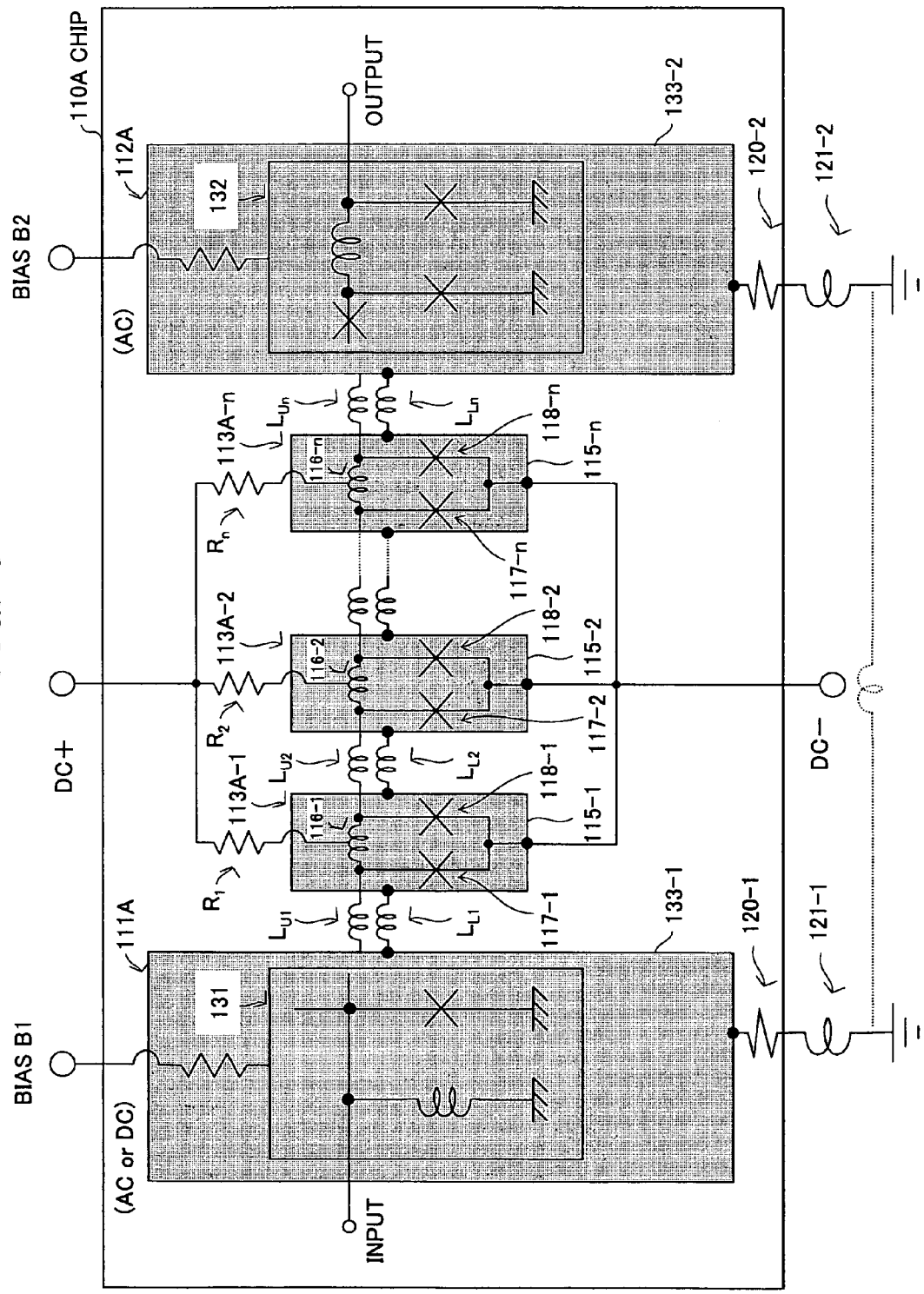
FIG. 13 is an illustrative drawing showing a first embodiment of a superconducting SFQ circuit according to the second aspect of the invention.

FIG. 13 is an illustrative drawing showing a first embodiment of the superconducting SFQ circuit according to the second aspect of the invention. In FIG. 13, the same elements as those of FIG. 12 are referred to by the same numerals, and a description thereof will be omitted.

In FIG. 13, a chip 10A, which is a superconducting SFQ circuit according to the invention, includes a superconducting circuit 111A, a superconducting circuit 112A, and n stages of superconducting SFQ circuits 113A-1 through 113A-n. The superconducting SFQ circuits 113A-1 through 113A-n connect between the superconducting circuit 111A and the superconducting circuit 112A. Couplings to the biases and the ground are the same as in the construction shown in FIG. 12. The superconducting circuit 111A includes a superconducting SFQ circuit 131 and a ground plane 133-1, and the superconducting circuit 112A includes a superconducting SFQ circuit 132 such as an output circuit and a ground plane 133-2. The illustrated circuit configuration of the superconducting circuits 111A and 112A is provided for an illustration purpose only, and does not reflect an actual construction of the circuitry.

The superconducting SFQ circuits 113A-1 through 113A-n make up a Josephson transmission line. The superconducting SFQ circuit 113A-x (x=1, 2, . . . , n) includes a ground plane 115-x, an inductance 116-x, a Josephson junction 117-x, a Josephson junction 118-x, and inductances LUx and LLx that provide connections with adjoining circuits. With the two Josephson junctions 117-x and 118-x and the inductance 116-x being included in the superconducting SFQ circuit 113-x, a two stage construction of the JTL is provided. The inductance LUx is implemented by use of an ordinary wiring layer, and the inductance LLx is provided such as to connect adjacent grounds together in a ground plane layer or in another layer. The inductances LUx and LLx are implemented as crossconnects having such a thin width as to provide an inductance of a few pH or more.

The higher the frequency, the greater the impedance of inductance becomes. Even if the ground potential of the superconducting circuit 112A fluctuates due to an alternate bias current supplied to the superconducting circuit 112A, such fluctuation is absorbed by the inductances LL1 through LLn, and the ground potential of the superconducting circuit 111A is hardly affected. Further, since the JTL used for the propagation of SFQ signals has a large operating margin, the JTL is not susceptible to the fluctuation of the ground potential.

Figure 14:
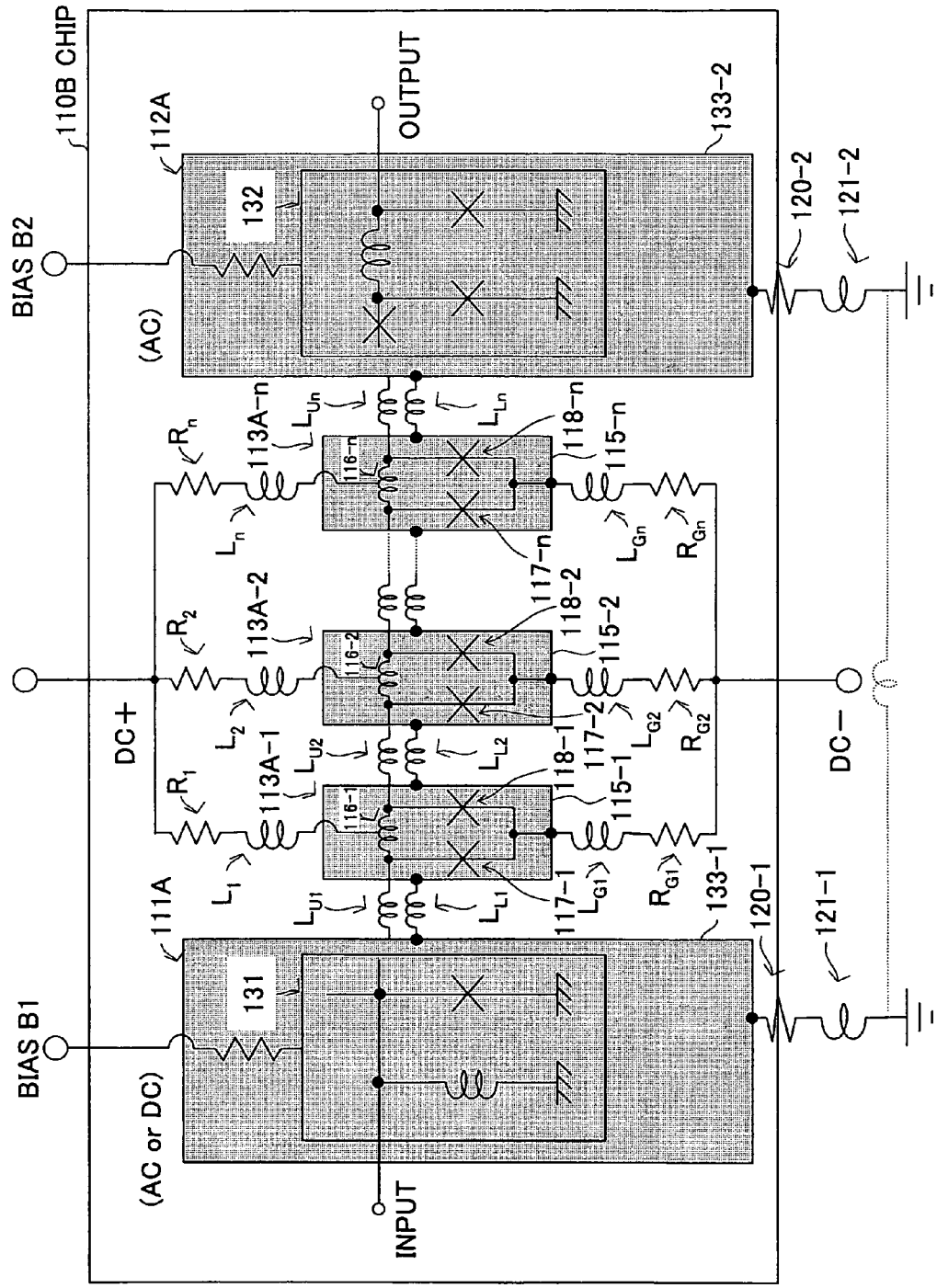
FIG. 14 is an illustrative drawing showing a second embodiment of the superconducting SFQ circuit according to the second aspect of the invention.

FIG. 14 is an illustrative drawing showing a second embodiment of the superconducting SFQ circuit according to the second aspect of the invention. In FIG. 14, the same elements as those of FIG. 13 are referred to by the same numbers, and a description thereof will be omitted.

In FIG. 14, a chip 110B, which is a superconducting SFQ circuit according to the invention, includes the superconducting circuit 111A, the superconducting circuit 112A, and the n stages of superconducting SFQ circuits 113A-1 through 113A-n. The superconducting SFQ circuits 113A-1 through 113A-n make up a Josephson transmission line (JTL). The superconducting SFQ circuit 113A-x (x=1, 2, . . . , n) includes the ground plane 115-x, the inductance 116-x, the Josephson junction 117-x, the Josephson junction 118-x, and the inductances LUx and LLx that provide connections with adjoining circuits.

The higher the frequency, the greater the impedance of inductance becomes. Even if the ground potential of the superconducting circuit 112A fluctuates due to an AC bias current supplied to the superconducting circuit 112A, such fluctuation is absorbed by the inductances LL1 through LLn, and the ground potential of the superconducting circuit 111A is hardly affected.

The circuit construction of the second embodiment shown in FIG. 14 differs from the circuit construction of the first embodiment shown in FIG. 13 in that an inductance Lx is provided in addition to the resistance Rx on the DC+ side of the superconducting SFQ circuit 113A-x, and inductance LGx and resistance RGx are provided on the DC− side. The inductances are implemented by laying out a thin, long wire in zigzag shape, and the resistances are implemented by use of a molybdenum thin film, for example.

With the inductance LGx and the resistance RGx provided on the ground side as shown in FIG. 14, the fluctuation of an AC bias leaking from the superconducting circuit 112A to the JTL (i.e., the superconducting SFQ circuits 113A-1 through 113A-n) is reduced. When the ground planes 115-1 through 115-n of the JTL are directly connected to the ground as in the construction shown in FIG. 13, a path through the JTL is closer to the ground, so that the ground potential ends up fluctuating due to the leakage of AC bias fluctuation. The construction shown in FIG. 14 prevents the leakage of AC bias fluctuation.

Figure 15:
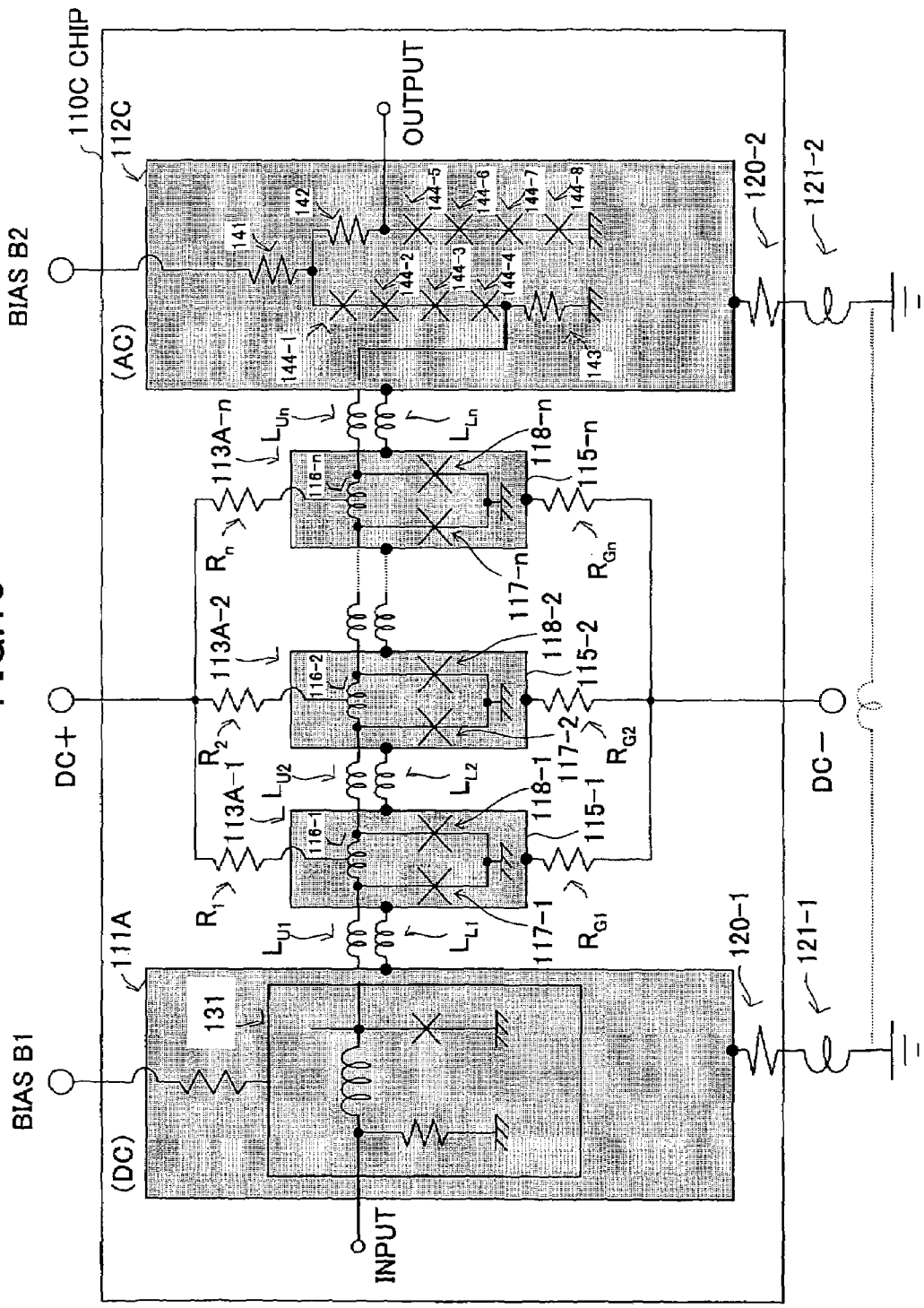
FIG. 15 is an illustrative drawing showing a third embodiment of the superconducting SFQ circuit according to the second aspect of the invention.

FIG. 15 is an illustrative drawing showing a third embodiment of the superconducting SFQ circuit according to the second aspect of the invention. In FIG. 15, the same elements as those of FIG. 14 are referred to by the same numbers, and a description thereof will be omitted.

In FIG. 15, a chip 110C, which is a superconducting SFQ circuit according to the invention, includes the superconducting circuit 111A, a superconducting circuit 112C, and the n stages of superconducting SFQ circuits 113A-1 through 113A-n. The superconducting SFQ circuits 113A-1 through 113A-n make up a Josephson transmission line. The superconducting SFQ circuit 113A-x (x=1, 2, . . . , n) includes the ground plane 115-x, the inductance 116-x, the Josephson junction 117-x, the Josephson junction 118-x, and the inductances LUx and LLx that provide connections with adjoining circuits. A resistance Rx is provided on the DC+ side and a resistance RGx is provided on the DC− side of the superconducting SFQ circuit 113A-x. Such resistance is implemented by use of a molybdenum thin film, for example.

The circuit construction of the third embodiment shown in FIG. 15 differs from the circuit construction of the second embodiment shown in FIG. 14 mainly in that a high-voltage gate having a multi-stage structure is used as the superconducting circuit 112C. The superconducting circuit 112C includes resistors 141 through 143 and Josephson junctions 144-1 through 144-8. The Josephson junctions 144-1 through 144-4 and the resistor 143 are connected one over another to form multiple stages, to which the AC bias B2 is applied via the resistor 141. In parallel with this multiple stage structure, the resistor 142 and the Josephson junctions 144-5 through 144-8 are connected one over another to form multiple stages, to which the AC bias B2 is applied via the resistor 141. In this manner, a high-voltage gate having four-stage parallel connections is constructed. The circuit construction shown in FIG. 15 is not a limiting example, and other circuit constructions may as well be used for a high-voltage gate.

The provision of the separation-purpose superconducting SFQ circuits will bring about a particularly beneficial result when the superconducting circuit 111A is an A/D converter or the like in which the resolution of an input signal is affected by the fluctuation of the ground.

Figure 16:
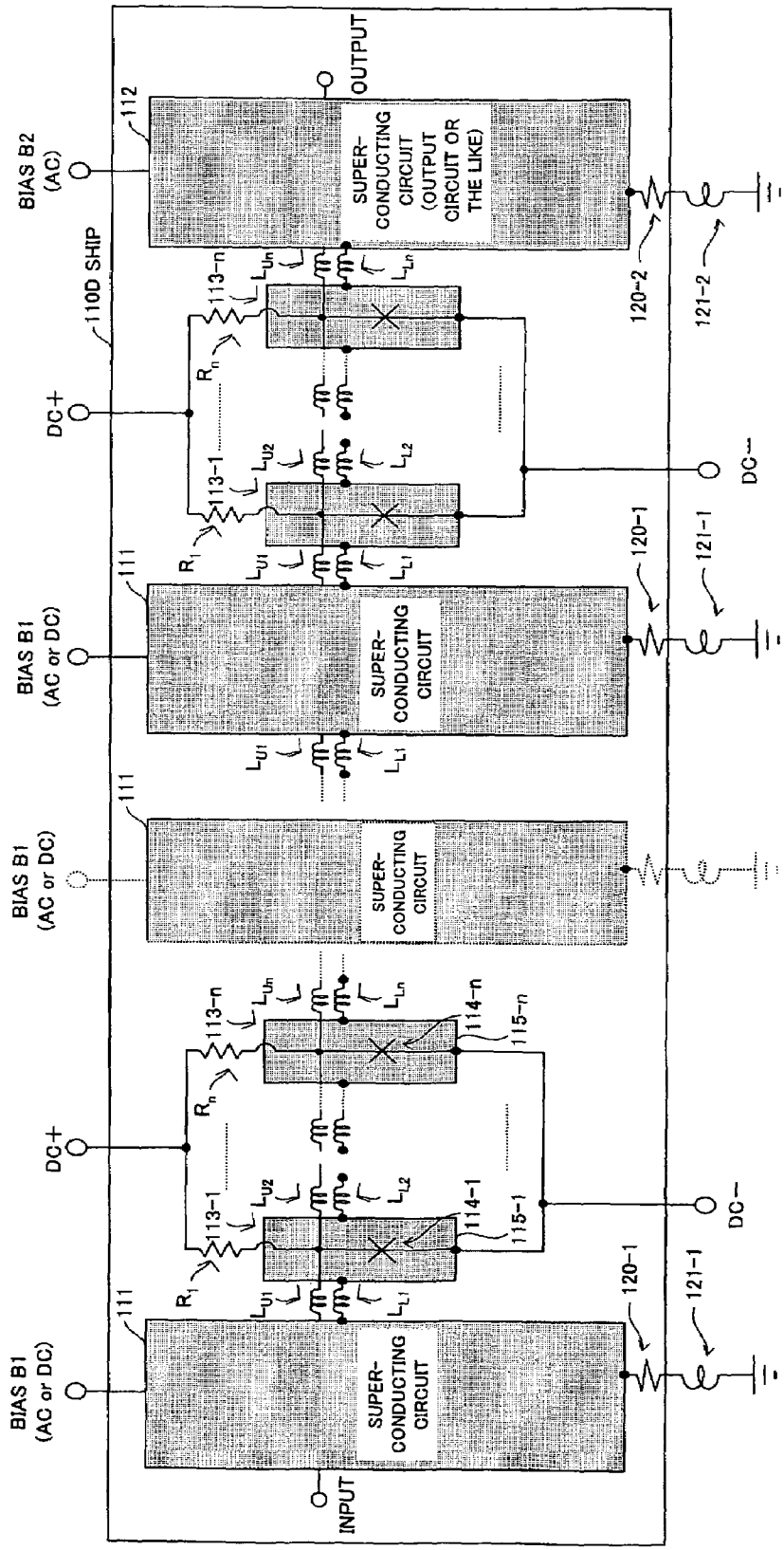
FIG. 16 is an illustrative drawing showing a fourth embodiment of the superconducting SFQ circuit according to the second aspect of the invention.

FIG. 16 is an illustrative drawing showing a fourth embodiment of the superconducting SFQ circuit according to the second aspect of the invention. In FIG. 16, the same elements as those of FIG. 12 are referred to by the same numbers, and a description thereof will be omitted.

The construction shown in FIG. 16 is characterized in that a plurality of superconducting circuits 111 are provided in a single chip 110D, and are coupled via the separation-purpose (isolation-purpose) superconducting SFQ circuits 113-1 through 113-n. Further, the superconducting circuit 112 such as an output circuit driven by an AC bias is coupled to the adjacent superconducting circuit 111 through the superconducting SFQ circuits 113-1 through 113-n in the same manner as in the construction shown in FIG. 12.

Even if two or more superconducting circuits are connected to each other as shown in FIG. 16, the provision of the separation-purpose superconducting SFQ circuits between superconducting circuits makes it possible to suppress the ground fluctuation of a superconducting circuit that is generated by the fluctuation of an AC bias supplied to another superconducting circuit.

Figure 17:
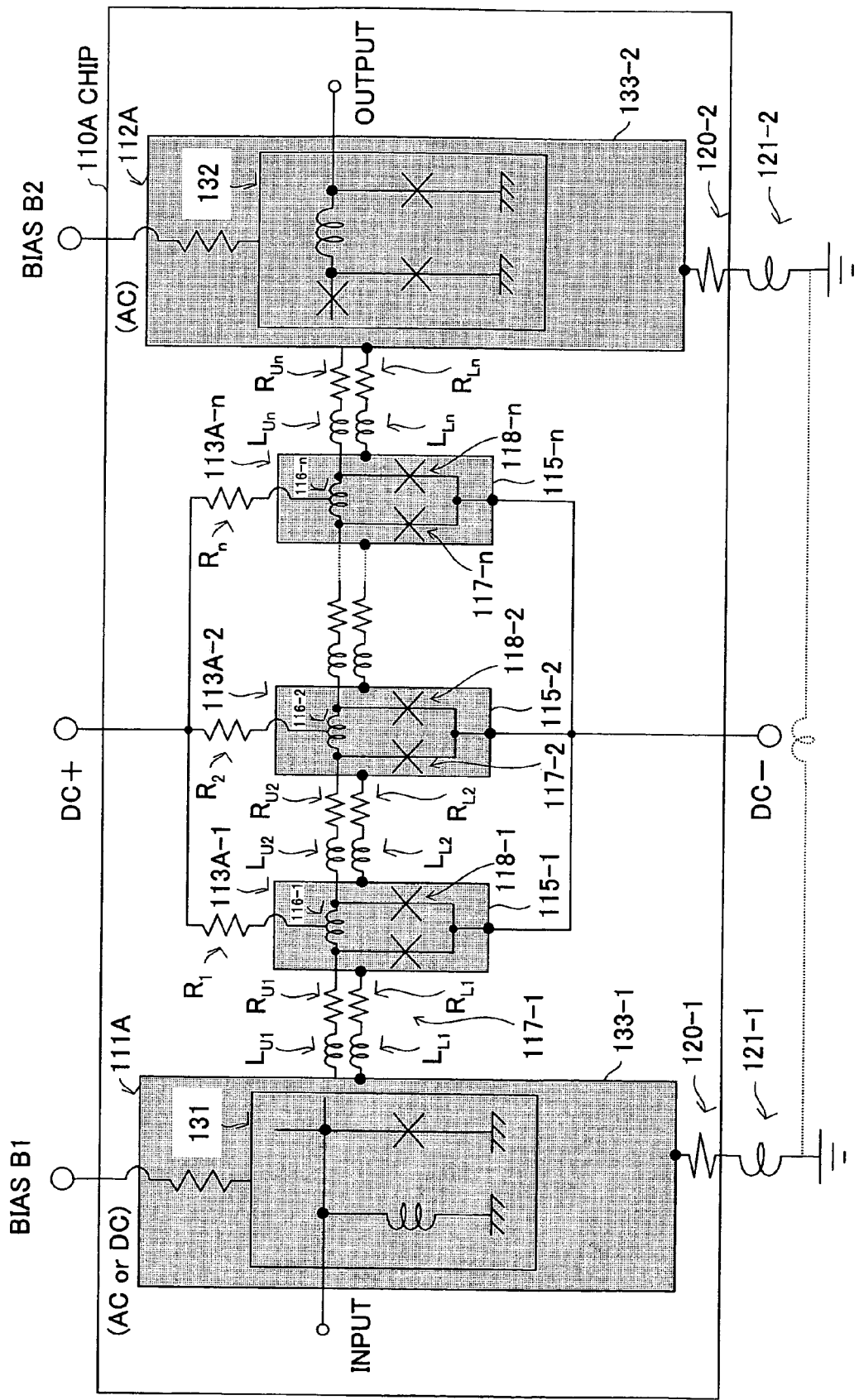
FIG. 17 is an illustrative drawing showing a fifth embodiment of the superconducting SFQ circuit according to the second aspect of the invention.

FIG. 17 is an illustrative drawing showing a fifth embodiment of the superconducting SFQ circuit according to the second aspect of the invention. In FIG. 17, the same elements as those of FIG. 12 are referred to by the same numbers, and a description thereof will be omitted.

In FIG. 17, a chip 110A, which is a superconducting SFQ circuit according to the invention, includes the superconducting circuit 111A, the superconducting circuit 112A, and the n stages of superconducting SFQ circuits 113A-1 through 113A-n. The superconducting SFQ circuits 113A-1 through 113A-n connect between the superconducting circuit 111A and the superconducting circuit 112A. Couplings to the biases and the ground are the same as in the construction shown in FIG. 12. The superconducting circuit 111A includes the superconducting SFQ circuit 131 and the ground plane 133-1, and the superconducting circuit 112A includes the superconducting SFQ circuit 132 such as an output circuit and the ground plane 133-2. The illustrated circuit configuration of the superconducting circuits 111A and 112A is provided for an illustration purpose only, and does not reflect an actual construction of the circuitry.

The superconducting SFQ circuits 113A-1 through 113A-n make up a Josephson transmission line. The superconducting SFQ circuit 113A-x (x=1, 2, . . . , n) includes the ground plane 115-x, the inductance 116-x, the Josephson junction 117-x, the Josephson junction 118-x, the inductances LUx and LLx for providing connections with an adjoining circuit, and both or at least one of the resistances RUX and RLX that are sufficiently smaller (e.g., 0.2 ohms) than the normal resistance of a Josephson junction. RUX and RLX allow an SFQ pulse to propagate if they are sufficiently smaller than the normal resistance of a Josephson junction (IEEE Transactions on Applied Superconductivity, Vol. 10, No. 3, Sep. 2000, p. 1637-1641). With the two Josephson junctions 117-x and 118-x and the inductance 116-x being included in the superconducting SFQ circuit 113-x, a two stage construction of the JTL is provided. The inductance LUx is implemented by use of an ordinary wiring layer, and the inductance LLx is provided such as to connect adjacent grounds together in a ground plane layer or in another layer. The inductances LUx and LLx are implemented as cross-connects having such a thin width as to provide an inductance of a few pH or more. Further, RUX and RLX are implemented by use of conducting material such as Mo, Au, etc.

The higher the frequency, the greater the impedance of inductance becomes. Even if the ground potential of the superconducting circuit 112A fluctuates due to an alternate bias current supplied to the superconducting circuit 112A, such fluctuation is absorbed by the inductances LL1 through LLn, and the ground potential of the superconducting circuit 111A is hardly affected. Further, since the JTL used for the propagation of SFQ signals has a large operating margin, the JTL is not susceptible to the fluctuation of the ground potential. Moreover, the resistances RUX and RLX, provided in series with LUX and LLX, respectively, serve to prevent the leakage of a DC electric current between circuits.

FIGS. 18A through 18D are diagrams showing an example of a circuit layout and an example of the results of an experiment according to the second aspect of the invention.

FIG. 18A illustrates the layout of circuitry on a chip 150 in which two superconducting circuits are coupled to each other via a separation-purpose superconducting SFQ circuit. Squares situated on the upper side and lower side of the chip 150 are signal pads and power-supply pads. In the middle of the chip 150, the two superconducting circuits and the separation-purpose superconducting SFQ circuit are arranged. FIG. 18B illustrates a circuit portion 151 that is an expanded view of the separation-purpose superconducting SFQ circuit. In FIG. 18B, portions depicting zigzag cross-connects are inductances provided on a path for supplying a DC bias to the separation-purpose superconducting SFQ circuit, and correspond to the inductances L1 through Ln and LG1 through LGn of FIG. 14, for example.

FIG. 18C is a block diagram showing the construction of the circuit of FIG. 18A. As shown in FIG. 18C, an SFQ pulse is output from an input circuit (DC/SFQ+JTL) 152, which generates the SFQ pulse in response to an input having a logic level of a room temperature semiconductor circuit. The SFQ pulse propagates through a ground-separation-purpose JTL 153, and is output from an output circuit (JTL+SFQ/DC) 154, which converts the received SFQ pulse into a logic level of a room temperature semiconductor circuit.

FIG. 18D is a diagram showing an example of the results of an experiment. A signal corresponding to the timing of AC bias input is shown as "CLOCK". At intervals corresponding to the intervals of the clock pulses, logic levels "1/0" are output. In this example, the input signal sequence is "1010100110", which is correctly reproduced as an output signal.

As previously described, in order to allow an SFQ pulse to propagate, the product of the inductance L of a superconducting loop serving as the basic structure of an SFQ circuit and the critical current Ic of a Josephson junction needs to be smaller than the value f0 of magnetic flux quantum, and preferably smaller than f0/2. Here, f0 is 2×10−15 weber. If the critical current Ic is set to 0.1 mA, for example, the inductance L needs to be set to 20 pH, and preferably to 10 pH or less. Within a range that satisfies those requirements, the upper limits of inductances are determined. As for the lower limits, an inductance that is not sufficiently zero suffices. By setting inductances in this manner, SFQ pulses responsive to an input signal properly propagate through the JTL, and appear as a correct output signal as shown in the experiment results shown in FIG. 18D.

Figure 19:
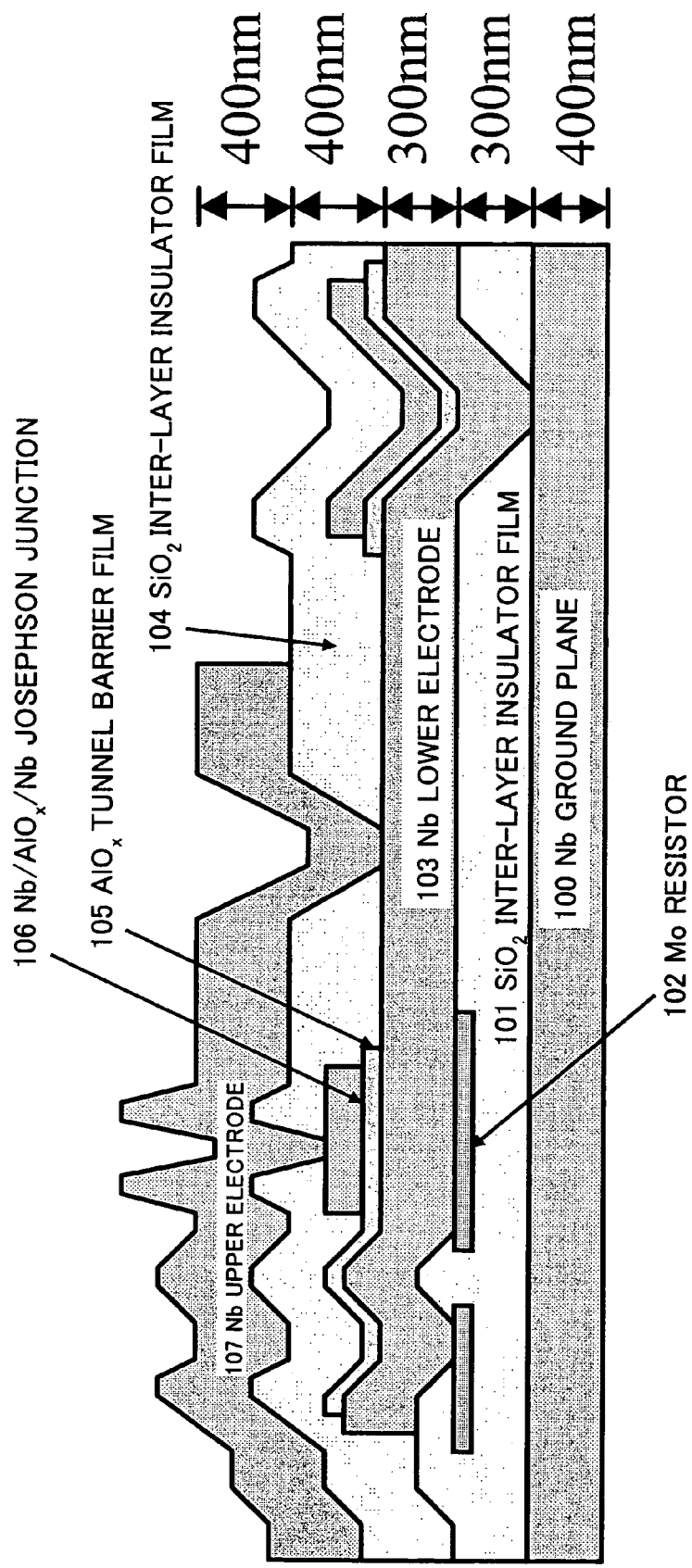
FIG. 19 is a cross-sectional view showing an example of the structure of a superconducting circuit device based on the Nb-junction technology used in the experiment.

FIG. 19 is a cross-sectional view showing an example of the structure of the superconducting circuit device based on the Nb-junction technology used in the above-described experiment.

The superconducting circuit device of FIG. 19 includes an Nb ground plane 100, an SiO2 inter-layer insulation film 101, an Mo resistor 102, an Nb lower electrode 103, an SiO2 inter-layer insulation film 104, an AlOx tunnel barrier film 105, an Nb/AlOx/Nb Josephson junction 106, and an Nb upper electrode 107. The circuit as shown in FIG. 18A is properly constructed by implementing a superconducting circuit device as shown in FIG. 19. This construction is only an example, and the superconducting circuit device used in the invention is not limited to such construction.

In the following, a third of the invention will be described.

Figure 20:
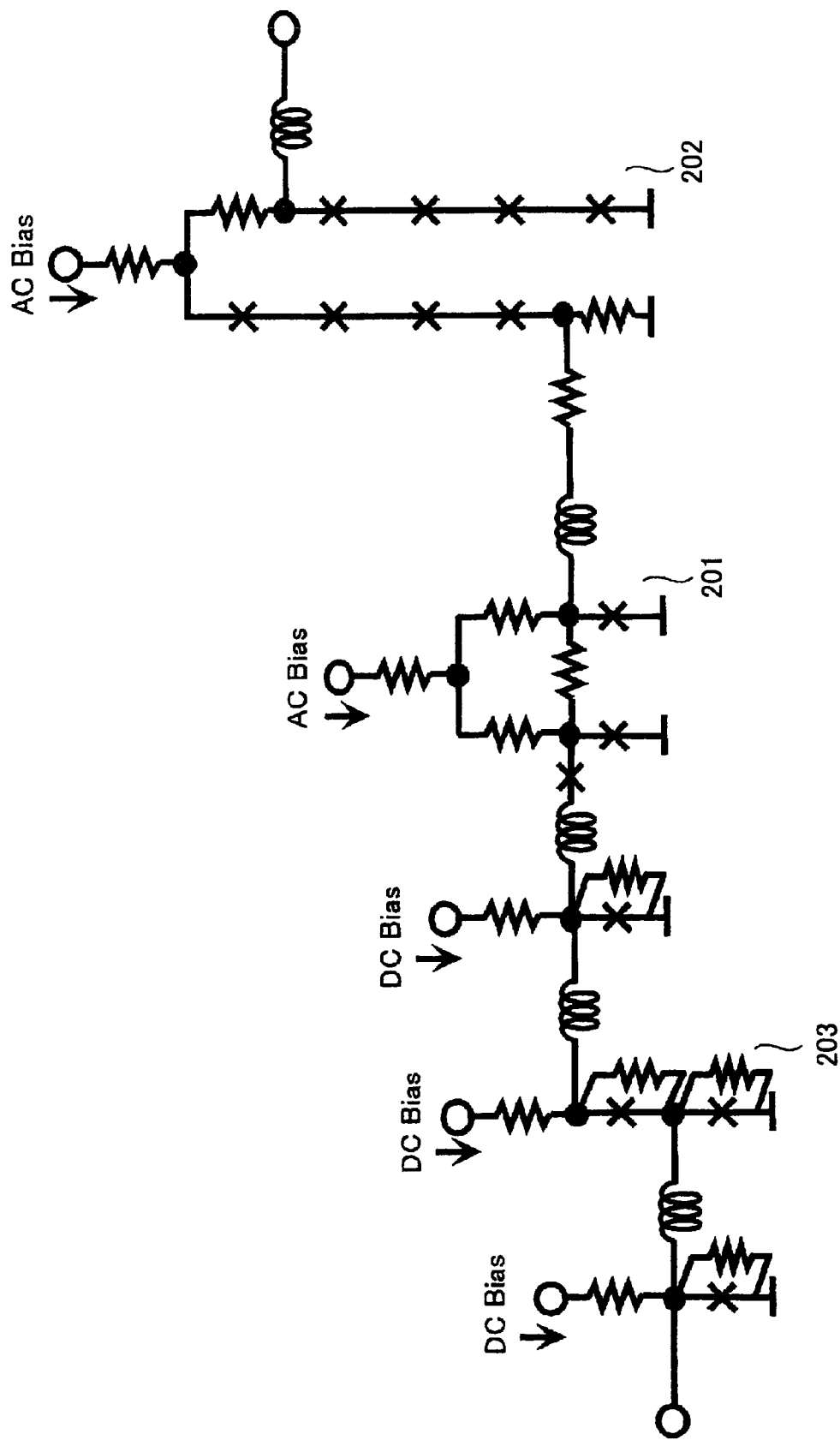
FIG. 20 is a circuit diagram showing a related-art latch-type interface circuit.

FIG. 20 is a circuit diagram showing a related-art latch-type interface circuit. As shown in FIG. 20, the related-art latch-type interface circuit includes an SFQ latch gate 201 for converting an SFQ pulse supplied from an SFQ circuit situated at a preceding stage into a gap-voltage level on the order of millivolts, a high-voltage Josephson gate 202 for amplifying the output voltage of the SFQ latch gate 201, and an SFQ buffer gate 203 for preventing the SFQ circuit at the preceding stage from malfunctioning due to the operation of the high-voltage Josephson gate 202.

As the high-voltage Josephson gate 202, a plurality of Josephson junctions and a resistor are connected in series to form two of such series connections, and these two series connections are placed in opposite sequences and connected in parallel with each other, with one end of such parallel connection being coupled to an AC bias terminal, and the other end thereof being coupled to a ground. Such a configuration is known in the art. The output of the SFQ latch gate 201 is applied to a junction between the grounded resistor and a Josephson junction. An output voltage pulse is output from a joint point between the resister on the AC-bias-terminal side and a Josephson junction (Japanese Patent Application Publication No. 64-16020).

Figure 21:
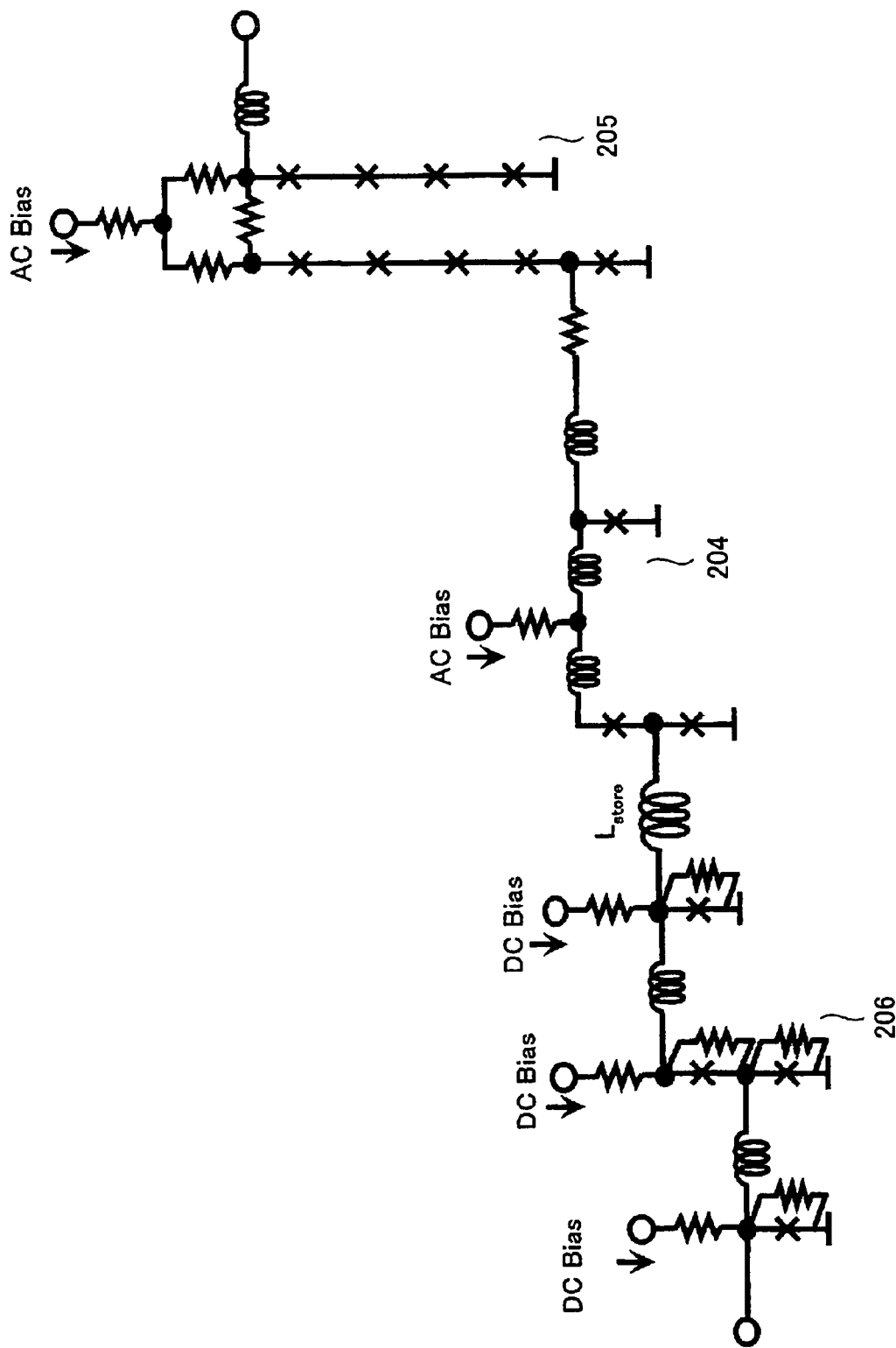
FIG. 21 is a circuit diagram showing another example of an interface circuit using a high-voltage Josephson gate.

FIG. 21 is a circuit diagram showing another example of an interface circuit using a high-voltage Josephson gate. The circuit shown in FIG. 21 is comprised of three stages of gates like the interface circuit shown in FIG. 20, and includes an SFQ latch gate 204, a high-voltage Josephson gate 205, and an SFQ buffer gate 206. At a stage prior to the SFQ latch gate 204, a sufficiently large inductance LSTORE is provided, so that a superconducting loop inclusive of this inductance LSTORE temporarily stores an SFQ pulse (U.S. Pat. No. 4,859,879; Hideo Suzuki, et al., "Applications of Synchronized Switching in Series-Parallel-Connected Josephson Junctions," IEEE Transactions on Electron Devices, November 1999, Vol. 37, No. 11, pp. 2399-2405; J. X. Przybysz and et. al., "Interface Circuits for Input and Output of Gigabit per Second Data," International Superconductive Electronics Conference (ISEC'95)), 8-3, p. 304-306; J. X. Przybysz and et. al., "Interface Circuits for Chip-to-Chip Data Transfer at GHz Rates," IEEE Transactions on Applied Superconductivity, Jun. 1997, Vol. 7, No. 2, pp. 2657-2660; Donald L. Miller and et. al., "A Josephson Sigma-Delta Analog-to-Digital Converter Using a High-Je Process," 8th International Superconductive Electronics Conference (ISECπ01 ), Jun. 2001pp 123-124). Further, various technologies relating to the superconducting SFQ logic circuit have been reported (e.g., K. K. Likharev and V. K. Semenov, "RSFQ logic/Memory Family: A New Josephson-Junction Technology for Sub-Teraherts-Clock-Frequency Digital Systems," IEEE transaction on Applied Superconductivity, Vol. 1, No. 1, Mar. 1991, p. 3-28).

In the interface circuit having the construction shown in FIG. 20, the three stages of gates are provided, resulting in a large number of Josephson junctions, and the circuit occupying a large area. Further, two or more gates such as the SFQ latch gate 201 and the high-voltage Josephson gate 202 are comprised of Josephson junctions having a hysteresis characteristic requiring an AC bias current. This requires a large AC bias current, thereby giving rise to a problem in that a ground ripple is large even if there is only one output interface. Further, since the operating margin of each interface circuit is small, it is difficult to output parallel data by using a plurality of interface circuits.

In the interface circuit having the construction shown in FIG. 20, further, there is a need to align timing between the AC bias currents and data output from the SFQ circuit of the preceding stage. This gives rise to a problem in that a timing margin becomes tight at high operation speed. The problem of a timing margin may be obviated by using the interface circuit having the construction shown in FIG. 21. The number of gates requiring an AC bias current is more than two in the same manner as in the circuit shown in FIG. 20, the AC bias current cannot be reduced, and it is difficult to suppress a ground ripple.

Accordingly, there is a need for a superconducting output interface circuit that allows for a large timing margin between the output data of an SFQ circuit of the preceding stage and an AC bias current supplied to the output interface circuit, and provides for a ground ripple to be small due to the smallness of the AC bias current, having small circuit size, and easy to be used in multiple numbers at the same time. Further, there is a need for a high-performance A/D converter or superconducting SFQ logic circuit based on such a superconducting output interface circuit.

In the following, embodiments of a superconducting output interface circuit and an A/D converter or superconducting SFQ logic circuit based on such a superconducting output interface circuit according to the invention will be described in conjunction with the accompanying drawings.

FIRST EMBODIMENT

Figure 22:
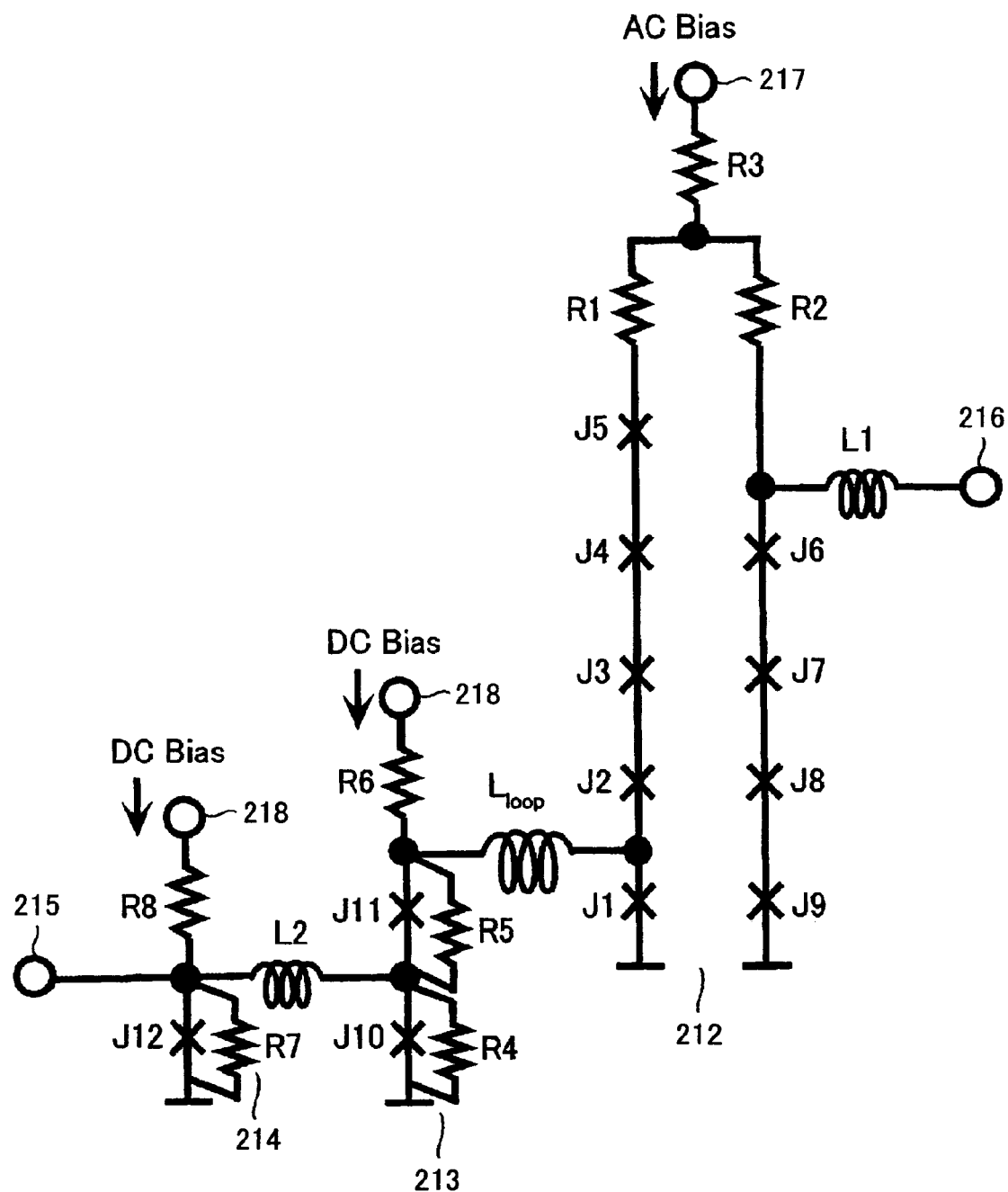
FIG. 22 is a circuit diagrams showing an example of an equivalent circuit of a superconducting output interface circuit according to the third aspect of the invention.

FIG. 22 is a circuit diagrams showing an example of an equivalent circuit of a superconducting output interface circuit according to the third aspect of the invention. As shown in FIG. 22, the output interface circuit includes an inductance LLOOP having sufficient size for storing an SFQ, a high-voltage Josephson gate 212, and an SFQ buffer gate 213. The SFQ buffer gate 213, the inductance LLOOP, and a Josephson junction J1 make up a superconducting loop. In FIG. 22, further, a Josephson transmission line (JTL) 214, an SFQ input terminal 215, and a voltage-pulse output terminal 216 are shown.

The high-voltage Josephson gate 212 includes the Josephson junction J1 constituting part of the superconducting loop, Josephson junctions J2, J3, J4, J5, J6, J7, J8, and J9, the number of which is not limited, and may be 8, for example, and three resistors R1, R2, and R3. The Josephson junctions J1, J2, J3, J4, and J5 are connected in series in the order named. The Josephson junction J1 at one end of this series connection is connected to the ground, and the Josephson junction J5 at the other end is connected to one end of the resistor R1. The other end of the resistor R1 is connected to one end of the resistor R3.

The joint point between the resistor R1 and the resistor R3 is connected to one end of the resistor R2. The Josephson junctions J6, J7, J8, and J9 are connected in series in the order named. The Josephson junction J6 at one end of this series connection is connected to the other end of the resistor R2, and the Josephson junction J9 at the other end is connected to the ground. The other end of the resistor R3 is connected to an AC bias terminal 217. The output terminal 216 is coupled through an inductance L1 to a joint point between the resistor R2 and the Josephson junction J6.

The SFQ buffer gate 213 includes two Josephson junctions J10 and J11 connected in series, and three resistors R4, R5, and R6. The Josephson junction J10 is connected to the ground. The Josephson junction J11 is connected to one end of the resistor R6. The other end of the resistor R6 is connected to a DC bias terminal 218. The resistor R4 is connected in parallel with the Josephson junction J10. In the same manner, the resistor R5 is connected in parallel with the Josephson junction J11. The inductance LLOOP constituting part of the superconducting loop connects between the joint of the resistor R6 and the Josephson junction J11 and the joint of the Josephson junction J1 and the Josephson junction J2 in the high-voltage Josephson gate 212.

The Josephson transmission line 214 includes a parallel connection comprised of a Josephson junction J12 and a resistor R7 connected in parallel, and further includes a resistor R8. One end of the parallel connection is connected to the ground, and the other end thereof is connected to one end of the resistor R8. The other end of the resistor R8 is connected to the DC bias terminal 218. The joint between the resistor R8 and the Josephson junction J12 is connected to the input terminal 215 an also to one end of an inductance L2. The other end of the inductance L2 is connected to a joint point between the Josephson junction J10 and the Josephson junction J11 in the SFQ buffer gate 213.

The Josephson junctions J1 through J9 constituting the high-voltage Josephson gate 212 are comprised of a juncture having hysteresis in its current-voltage characteristics (I-V characteristics). Further, the inductance LLOOP contained in the superconducting loop satisfies the following condition, LLOOP>f0/Ic Where F0 is a magnetic flux quantum, and Ic is the critical current of the Josephson junction J1 constituting part of the superconducting loop.

In the following, the operation of the output interface circuit shown in FIG. 22 will be described. An SFQ output from an SFQ circuit (not shown) provided at the preceding stage is supplied to the output interface via the input terminal 215. The SFQ then propagates through the Josephson transmission line 214 and the SFQ buffer gate 213 to arrive at the superconducting loop inclusive of the inductance LLOOP, and is stored in the superconducting loop. With the SFQ stored in the superconducting loop, a circulating current runs through the superconducting loop.

Thereafter, an AC bias current flows through the high-voltage Josephson gate 212, and the sum of the circulating current and the AC bias current reaches the critical current of the Josephson junction J1, resulting in the Josephson junction J1 being switched to a voltage state. Consequently, an imbalance is created between the voltage of a series connection comprised of the Josephson junctions J1 through J5 and the resistor R1 and the voltage of the other series connection comprised of the resistor R2 and the Josephson junctions J6 through J9. The junction having the smallest critical current among the Josephson junctions J6 through J9 is switched to a voltage state.

Following this, all the remaining Josephson junctions in the high-voltage Josephson gate 212 are switched to the voltage state. As a result, an electric current flows through the output side, generating a voltage nVg at the output terminal 216 that is the gap voltage Vg multiplied by the number n of the Josephson junctions J6 through J9 connected in series (n=4 in this example shown in FIG. 22). Namely, the output interface circuit shown in FIG. 22 converts the SFQ pulse supplied from the SFQ circuit of the preceding stage into a voltage level that is a multiple of the gap voltage.

Figure 23:
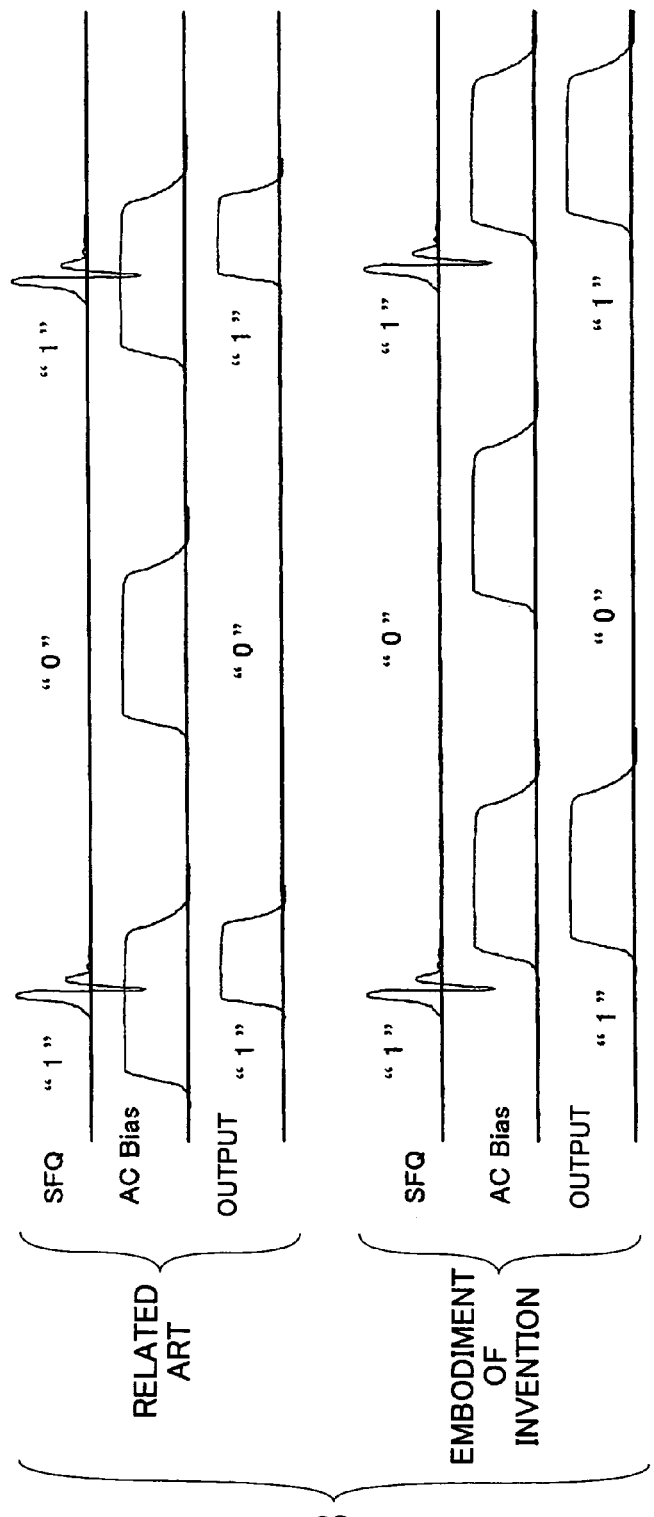
FIG. 23 is a signal waveform chart for explaining the timing margin of the output interface circuit shown in FIG. 22.

FIG. 23 is a signal waveform chart for explaining the timing margin of the output interface circuit shown in FIG. 22. In FIG. 23, three waveforms in the lower half relate to the output interface circuit shown in FIG. 22, and three waveforms in the upper half relate to the related-art output interface circuit shown in FIG. 20.

As can be seen from the three waveforms on the upper half of FIG. 23, a correct output voltage cannot be produced unless an SFQ output from the SFQ circuit arrives at the high-voltage Josephson gate 212 during a time period in which an AC bias current is active. That is, in order to obtain a correct output voltage, the SFQ needs to be supplied to the high-voltage Josephson gate 212 during a time in which the AC bias current is active.

In the output interface circuit of the present embodiment, on the other hand, a correct output voltage is produced even when the AC bias current becomes active after an SFQ arrives at the high-voltage Josephson gate 212, as shown in the three waveforms illustrated on the lower half of FIG. 23. This is because the SFQ arriving prior to the activation of the AC bias current is kept intact in the superconducting loop comprised of the SFQ buffer gate 213, the inductance LLOOP, and the Josephson junction J1.

If an SFQ arrives after the activation of the AC bias current, an output voltage is produced from the moment of such arrival in the same manner as in the related art. That is, the timing margin regarding the SFQ arriving after the activation of the AC bias current is the same as that of the related art, but a proper operation is attainable even when an SFQ arrives prior to the activation of the AC bias current. As a consequence, the timing margin prior to the activation of the AC bias current becomes larger than that of the related art. The output interface circuit of the present embodiment thus allows for an increased timing margin with respect to a clock signal for driving the SFQ circuit of the preceding stage relative to the AC bias current.

Figure 24:
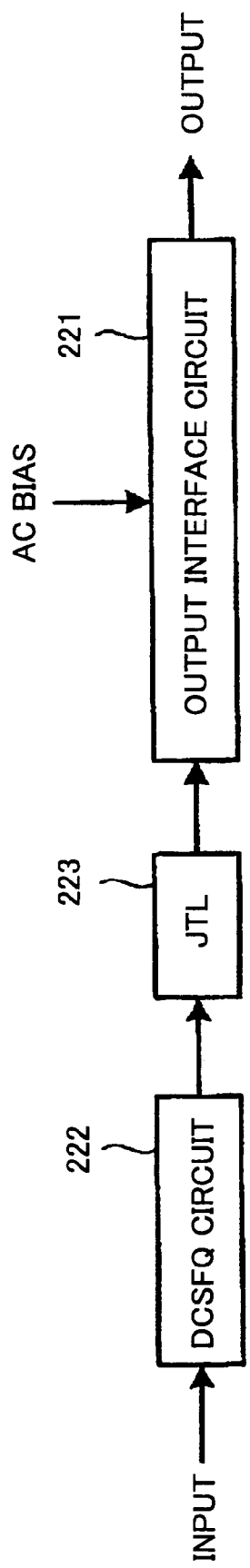
FIG. 24 is a block diagram showing the construction of a test circuit produced for the purpose of testing an output interface circuit having the construction shown in FIG. 22.

In the following, a description will be given of the results of an experiment that was conducted to verify the effectiveness of the output interface circuit shown in FIG. 22. As shown in FIG. 24, a test circuit was produced, in which a DCSFQ circuit 222 for converting a voltage pulse into an SFQ pulse and an SFQ circuit comprised of a Josephson transmission line (JTL) 223 were provided at a stage preceding an output interface circuit 221 having the construction shown in FIG. 22. The thin-film integrated circuit technology based on the Nb superconductor was used to produce the output interface circuit 221. A high-voltage Josephson gate of the output interface circuit 221 had the construction shown in FIG. 22 in which the series connection of the Josephson junctions J1 through J5 and the series connection of the Josephson junctions J6 through J9 were connected in parallel with each other.

The high-voltage Josephson gate was constructed by employing the Josephson junctions J1 through J9 having the lowest critical current (0.1 mA) that was achievable under the current technology of Nb-based integrated circuit process. As it turned out, the AC bias current was one sixth of that of the related art. According to simulation, the AC-bias margin at 5 GHz was between +21% and −18%, which was about three times larger than that of the related art. Further, the area size of the output interface circuit 221 was less than half the area size of the related art.

Figure 25:
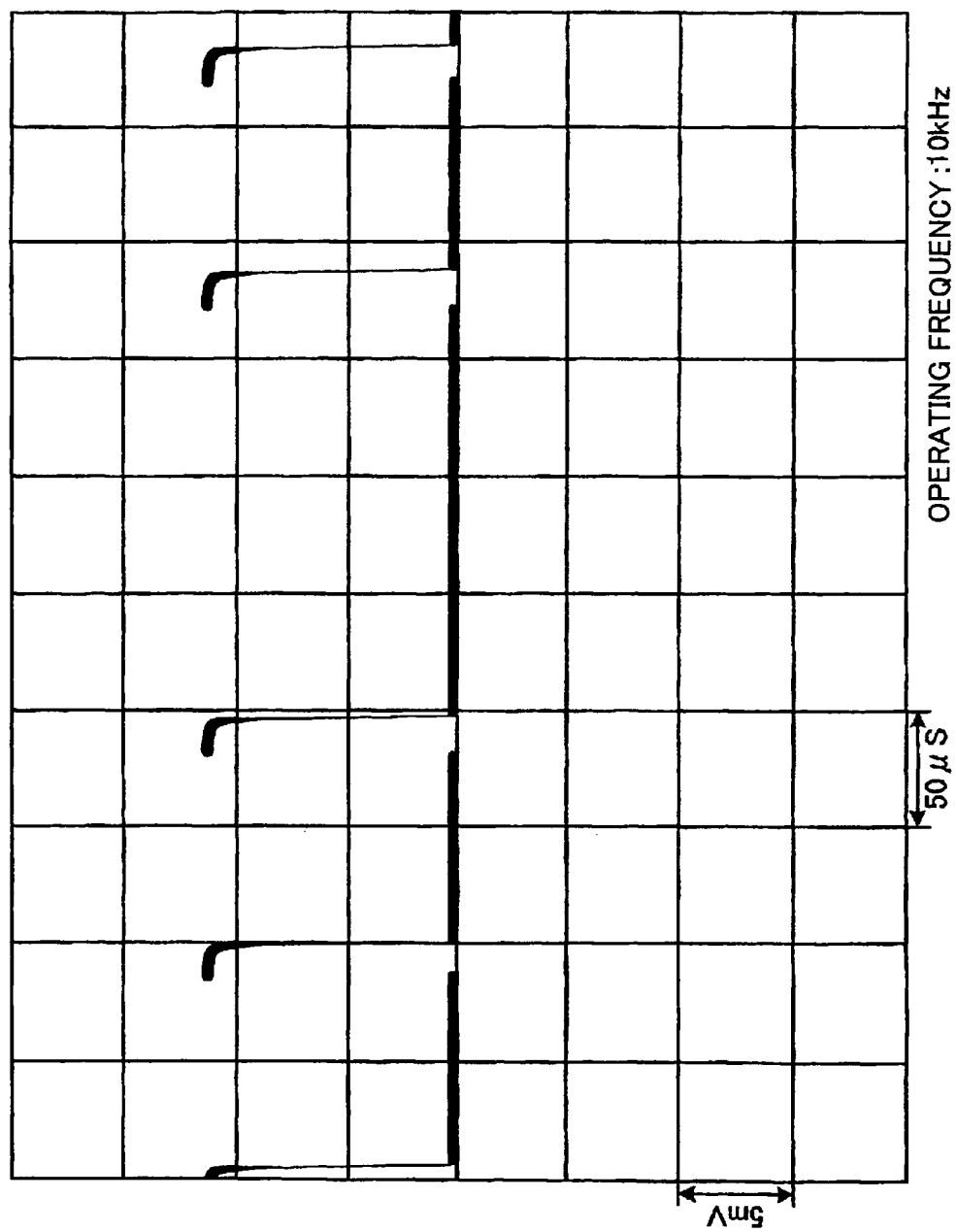
FIG. 25 is a diagram showing an output signal waveform obtained as a result of a low-speed function test.

FIG. 25 is a diagram showing an output signal waveform obtained as a result of a low-speed function test (operating frequency: 10 kHz). An input digital signal sequence was "1101". As shown in FIG. 25, the same sequence as the input signal sequence "1101" was repeatedly output. The amplitude of an output voltage was about 11 mV, which corresponded to the number (4) of the Josephson junctions J6 through J9 connected in series.

In the test described above, all the Josephson junctions J1 through J9 forming the high-voltage Josephson gate of the output interface circuit 221 were set to the substantially same critical current (0.1 mA). Alternatively, the Josephson junction J1 included in the superconducting loop for retaining an SFQ may be set to a larger critical current than the other Josephson junctions J2 through J9. With such provision, the Josephson junction J1 is prevented from switching to a voltage state at wrong timing even if the sum of the circulating current and the AC bias current undesirably fluctuates for some reason.

Figure 26:
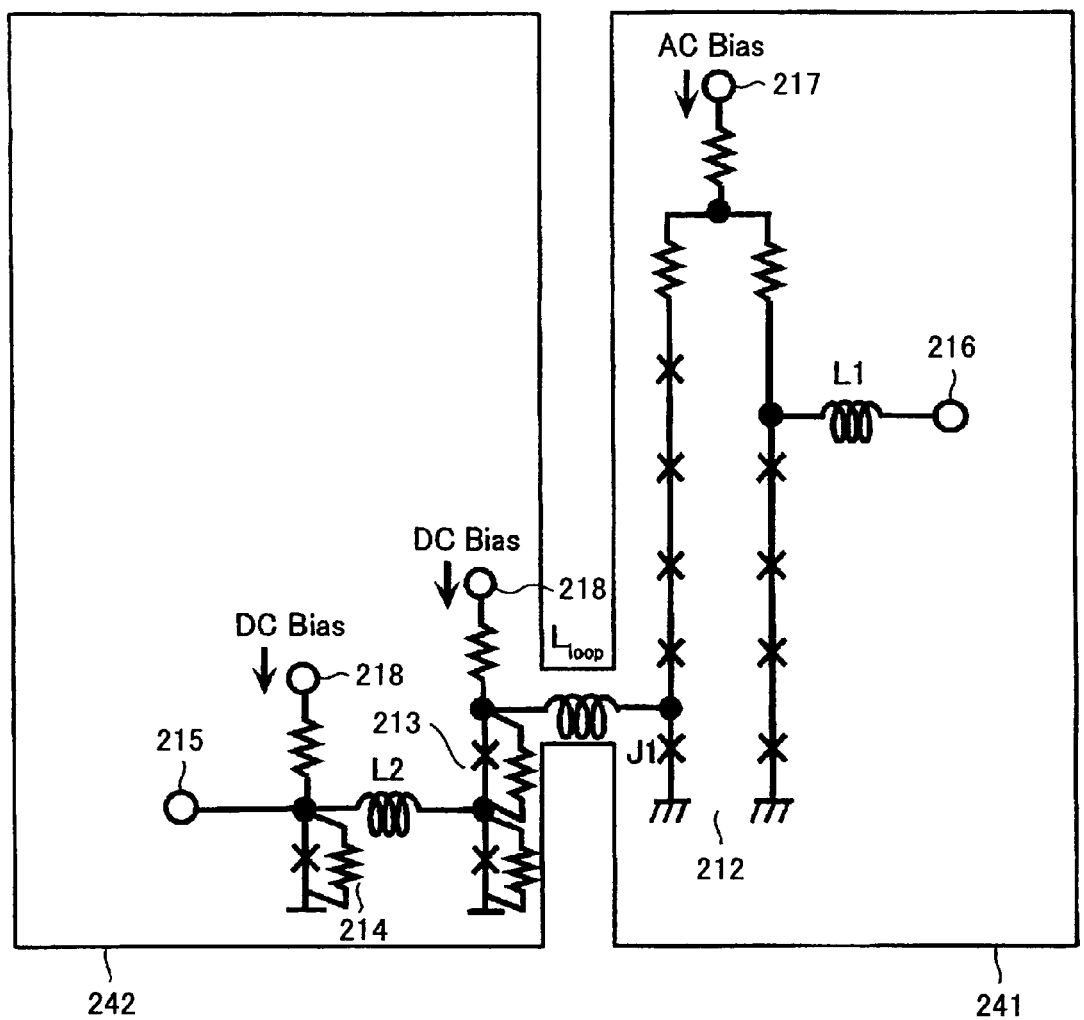
FIG. 26 is an illustrative drawing showing the designing of alternating-current (AC) ground separation.

In the following, a description will be given of the designing of ground separation in terms of AC currents with respect to the output interface circuit shown in FIG. 22. FIG. 26 is an illustrative drawing showing the designing of AC ground separation. In FIG. 26, an inductance Lloop is sufficiently large, so that the ground of the preceding SFQ circuit and the ground of the high-voltage Josephson gate 212 can be separated at the inductance Lloop in terms of AC currents. Before providing a detailed description of how to separate the grounds at the inductance Lloop, a description will be given first of a cross-sectional structure of a typical superconducting circuit device in order to facilitate the understanding.

Figure 27:
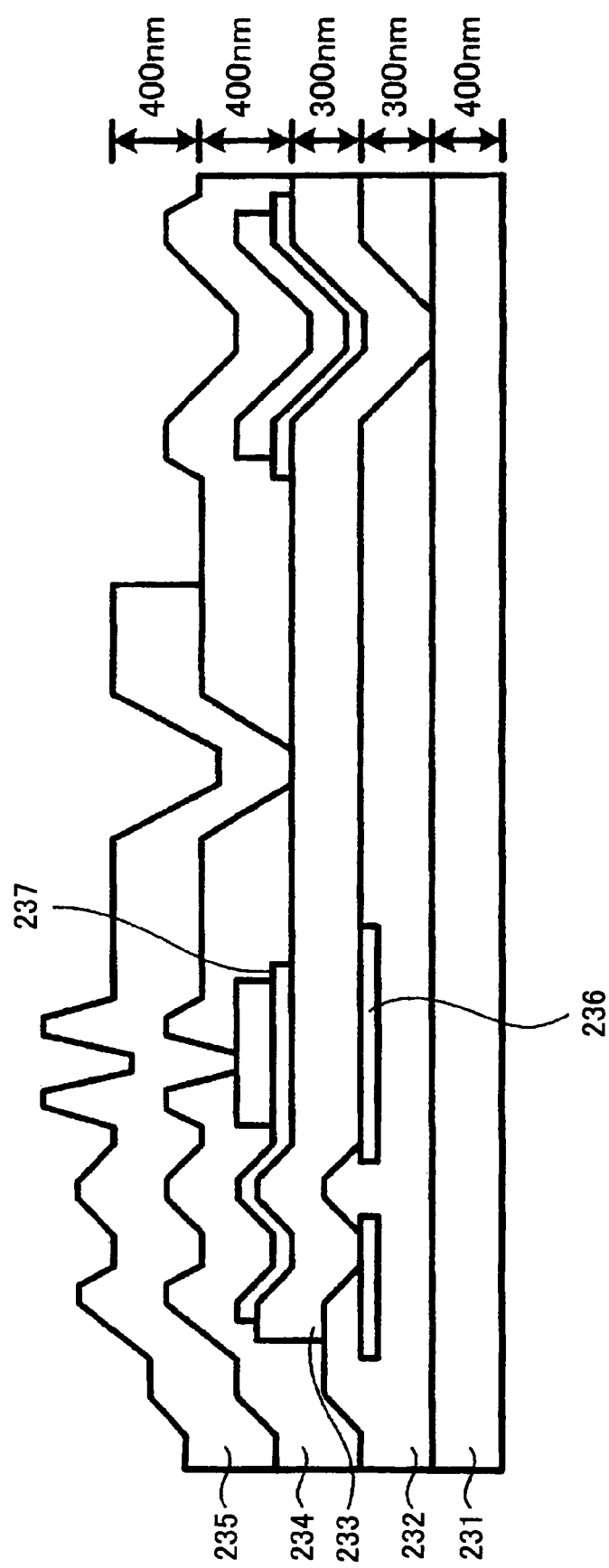
FIG. 27 is a cross-sectional view showing the construction of a typical Nb-based superconducting circuit device.

FIG. 27 is a cross-sectional view showing the construction of a typical Nb-based superconducting circuit device. As shown in FIG. 27, a superconducting circuit device is formed on an Nb ground plane 231. On the ground plane 231 having a thickness of 400 nm, for example, an inter-layer insulating film 232 such as SiO2 with a thickness of 300 nm is formed, on which an Nb lower electrode 233 having a thickness of 300 nm is further formed. On the lower electrode 233, an inter-layer insulating film 234 such as SiO2 having a thickness of 400 nm is formed, with an Nb upper electrode 235 having a thickness of 400 nm further formed thereon.

At a boundary between the lower inter-layer insulating film 232 and the lower electrode 233, a resistor 236 made of Mo or the like is selectively provided. At a boundary between the lower electrode 233 and the upper inter-layer insulating film 234, an AlOx tunnel barrier film 237 is selectively provided at a position corresponding to the resistor 236. The upper electrode 235 is in contact with the tunnel barrier film 237 through a via that penetrates through the inter-layer insulating film 234, thereby forming an Nb/AlOx/Nb Josephson junction.

With reference to FIG. 26 again, a description will be given of the designing of AC ground separation at the position of the inductance Lloop. To be specific, as shown in FIG. 26, the ground plane is partially removed around the inductance Lloop such as to leave only a portion corresponding to the position of the inductance Lloop, thereby forming the ground plane having a constricted portion at the position of the inductance Lloop. With this provision, the constricted portion of the ground plane has a sufficiently large inductance. If the impedance at high frequency is sufficiently large, a high-frequency AC bias current flowing into a ground plane 241 on the side of the high-voltage Josephson gate 212 does not flow into a ground plane 242 on the side of the SFQ circuit.

Figure 28:
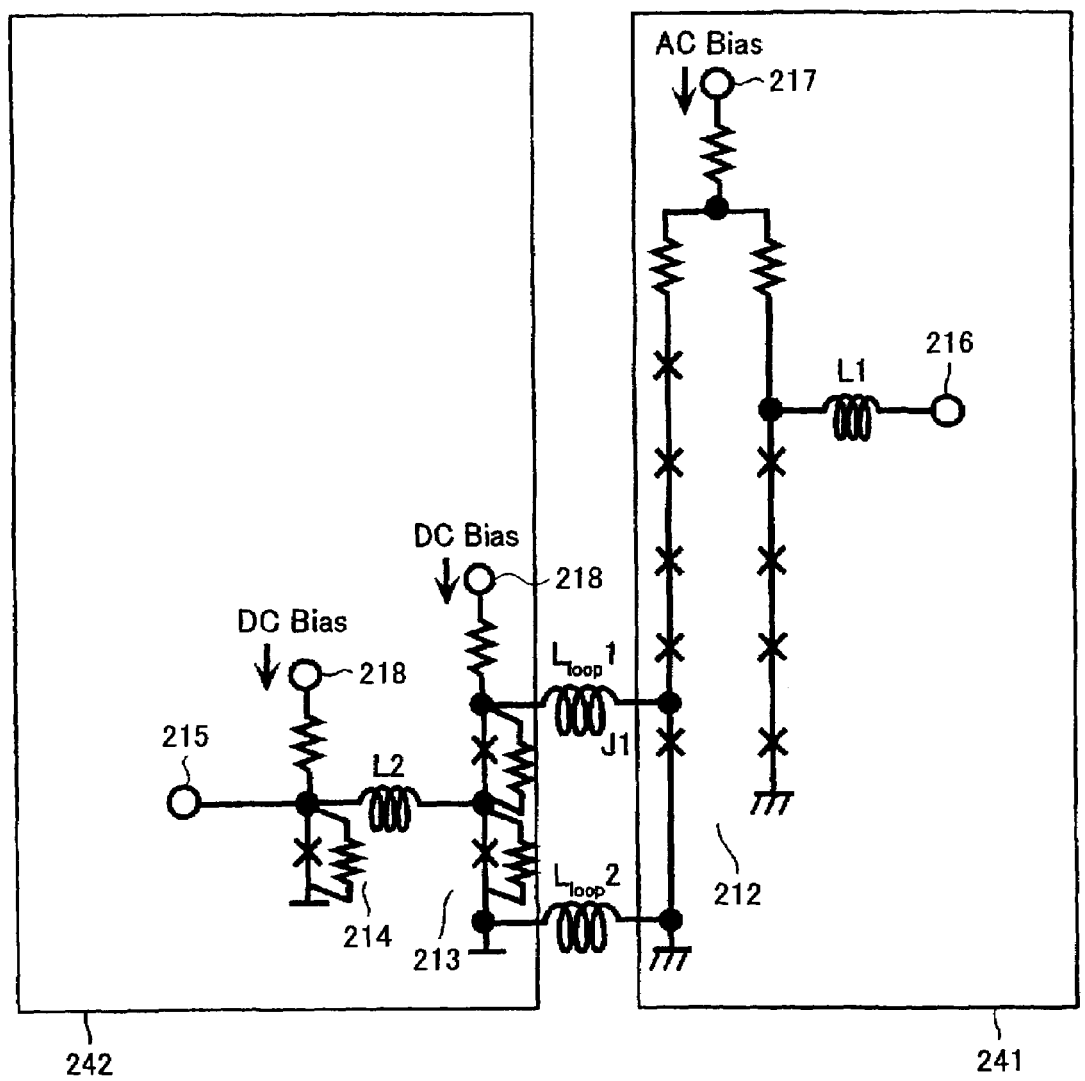
FIG. 28 is an illustrative drawing for explaining another example of the designing of alternating-current (AC) ground separation.

This is equivalent to AC separation between the ground plane 241 on the side of the high-voltage Josephson gate 212 and the ground plane 242 on the side of the SFQ circuit. It should be noted, however, that the ground plane 241 on the side of the high-voltage Josephson gate 212 and the ground plane 242 on the side of the SFQ circuit are coupled in terms of a DC current. As shown in FIG. 28, the ground plane 241 on the side of the high-voltage Josephson gate 212 and the ground plane 242 on the side of the SFQ circuit inclusive of the buffer gate may be physically separated, with a solder or the like made of superconducting material providing a coupling between the ground plane 241 on the side of the high-voltage Josephson gate 212 and the ground plane 242 on the side of the SFQ circuit.

In the construction shown in FIG. 28, an inductance Lloop1 corresponding to the inductance Lloop of FIG. 26 and an inductance Lloop2 coupling the grounds of the ground planes 242 and 242 constitute the inductance Lloop of FIG. 26. The construction shown in FIG. 28 is effective when a circuit of the high-voltage Josephson gate 212 and a circuit of the SFQ circuit are implemented on separate chips.

As shown in FIG. 26 and FIG. 28, AC ground separation makes it possible to suppress the effect on the SFQ circuit of a ground ripple caused by an AC bias current supplied to the high-voltage Josephson gate 212.

Figure 29:
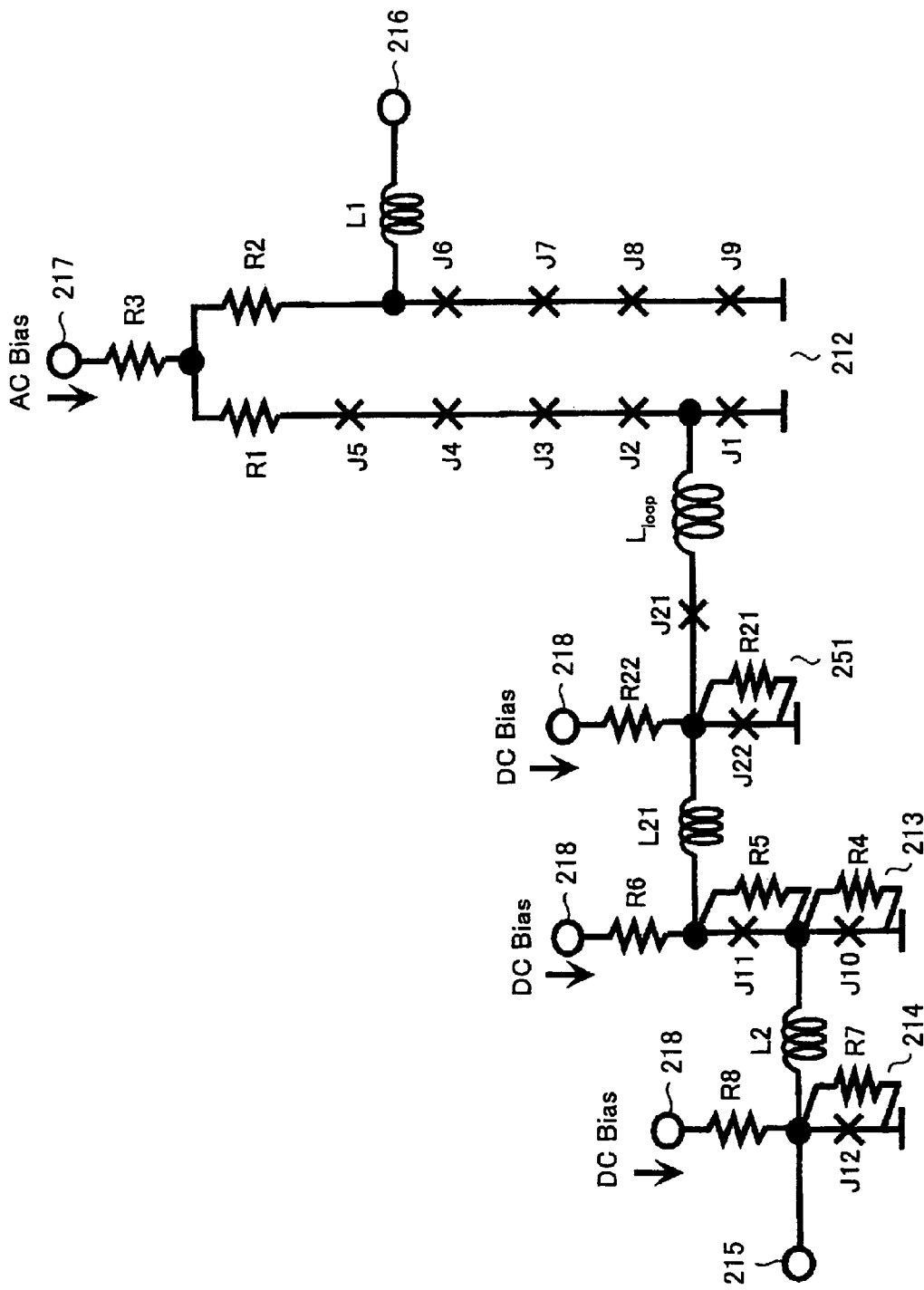
FIG. 29 is a circuit diagram showing another example of an equivalent circuit of the superconducting output interface circuit according to the third aspect of the invention.

FIG. 29 is a circuit diagram showing another example of an equivalent circuit of the superconducting output interface circuit according to the third aspect of the invention. The output interface circuit shown in FIG. 28 differs from the circuit shown in FIG. 22 in that an inductance L21, a Josephson transmission line 251, and an isolation-purpose Josephson junction J21 for letting an SFQ escape are provided between the SFQ buffer gate 213 and the inductance Lloop. The Josephson junction J21 lets an SFQ escape, thereby preventing the SFQ from returning to the SFQ circuit.

The Josephson transmission line 251 includes a parallel connection of a Josephson junction J22 and a resistor R21, and further includes a resistor R22. One end of the parallel connection is connected to the ground, and the other end thereof is connected to one end of the resistor R22. The other end of the resistor R22 is connected to the DC bias terminal 218. The joint point between the resistor R22 and the Josephson junction J22 is coupled via the inductance L21 to the junction between the Josephson junction J11 and the resistor R6 in the SFQ buffer gate 213, and is also coupled to the inductance Lloop via the Josephson junction J21.

The isolation-purpose Josephson junction J21 may alternatively be provided between the inductance Lloop and the high-voltage Josephson gate 212. A buffer gate or another SFQ circuit may be used in place of the Josephson transmission line 251 or together with the Josephson transmission line 251.

Figure 30:
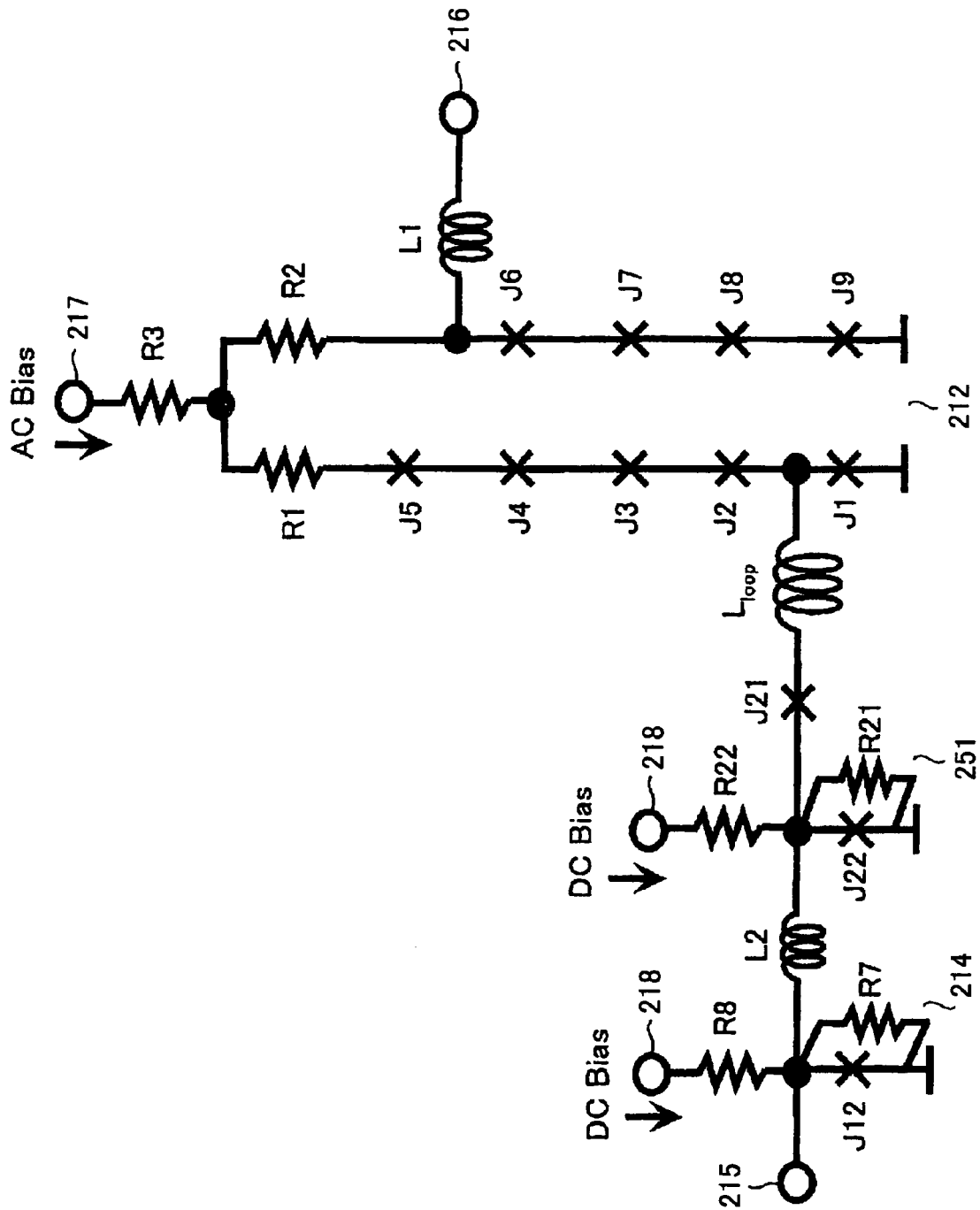
FIG. 30 is a variation of the output interface circuit shown in FIG. 29.

FIG. 30 is a variation of the output interface circuit shown in FIG. 29. Compared with the circuit shown in FIG. 29, the SFQ buffer gate 213 is removed, and the Josephson transmission line 214 and the Josephson transmission line 251 are coupled together via the inductance L2. In this construction, even through there is no SFQ buffer gate, the presence of the isolation-purpose Josephson junction J21 successfully prevents an SFQ from returning to the SFQ circuit.

Figure 31:
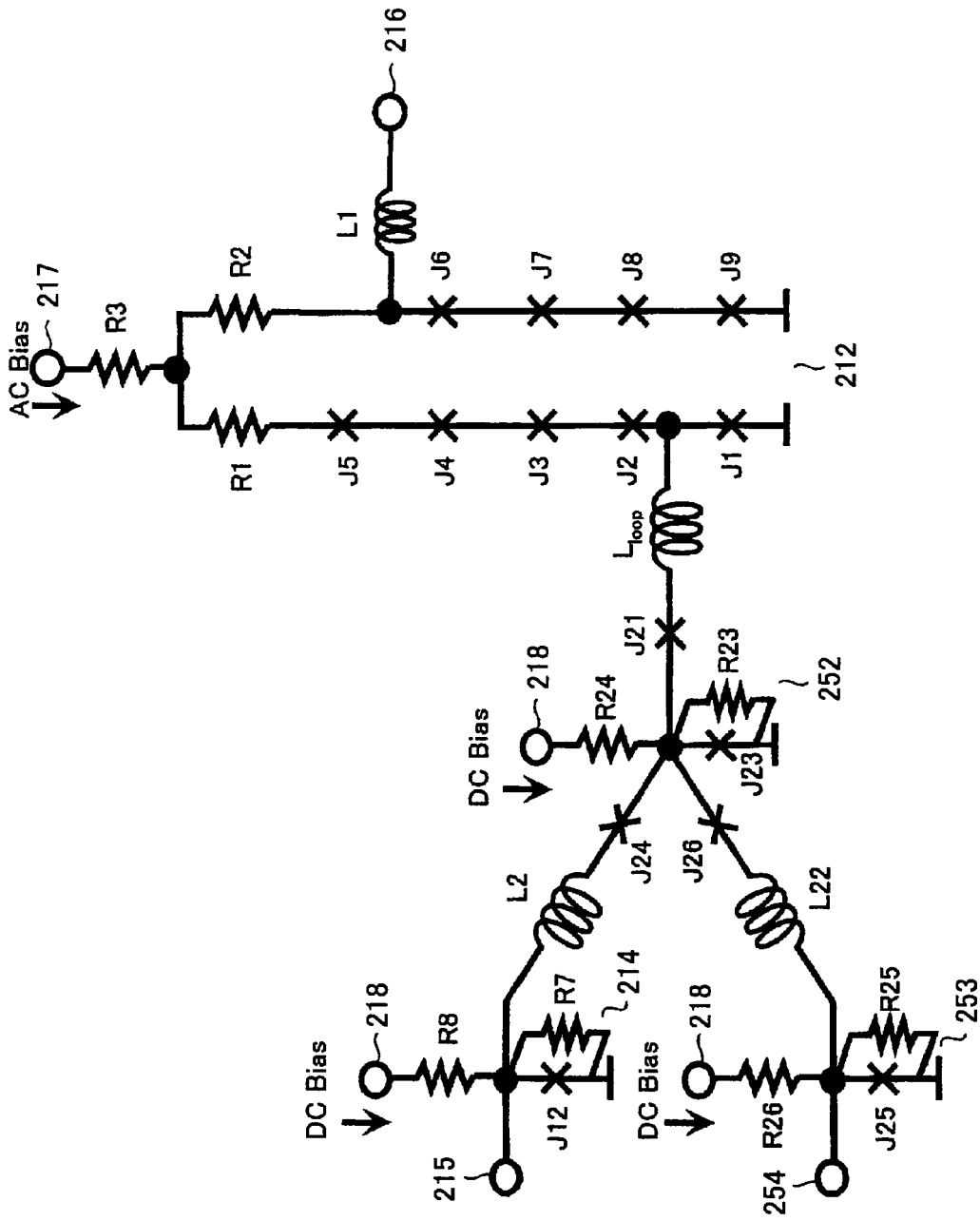
FIG. 31 is another variation of the output interface circuit shown in FIG. 29.

FIG. 31 is another variation of the output interface circuit shown in FIG. 29. Compared with the circuit shown in FIG. 29, a confluence buffer gate 252 for merging a plurality of SFQs is provided in place of the SFQ buffer gate 213 and the Josephson transmission line 251, thereby providing a plurality of signal incoming paths. The confluence buffer gate 252 merges an SFQ supplied from the input terminal 215 (referred to as the first input terminal 215 for the discrimination purpose) and an SFQ supplied from a second input terminal 254.

The confluence buffer gate 252 includes a parallel connection of a Josephson junction J23 and a resistor R23 connected in parallel, and further includes a resistor R24. One end of the parallel connection is connected to the ground, and the other end thereof is connected to one end of the resistor R24. The other end of the resistor R24 is connected to the DC bias terminal 218. The joint point between the resistor R24 and the Josephson junction J23 is coupled via the Josephson junction J21 to the inductance Lloop. The Josephson transmission line 214 connected to the first input terminal 215 is connected to the inductance L2. The inductance L2 is coupled via the Josephson junction J24 to a junction between the Josephson junction J23 and the resistor R24 in the confluence buffer gate 252.

The second input terminal 254 is connected to a junction between a resistor R26 and a parallel connection of a Josephson junction J25 and a resistor R25 wherein the parallel connection has one end thereof connected to the ground and the resistor R26 has one end thereof connected to the DC bias terminal 218. The joint point between the Josephson junction J25 and the resistor R26 in the Josephson transmission line 253 is connected to the inductance L22. The inductance L22 is coupled via the Josephson junction J26 to a junction between the Josephson junction J23 and the resistor R24 in the confluence buffer gate 252.

Figure 32:
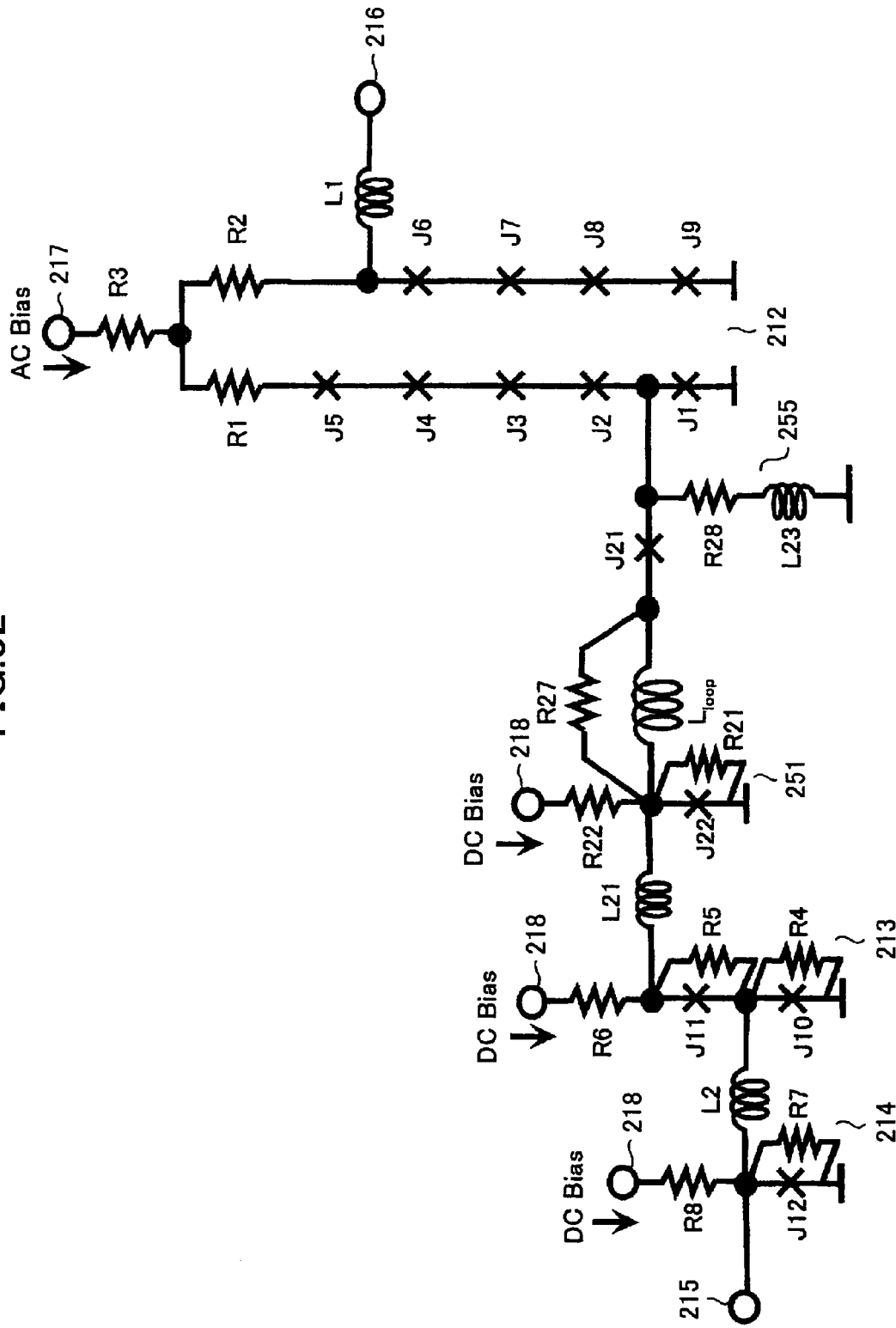
FIG. 32 is yet another variation of the output interface circuit shown in FIG. 29.

FIG. 32 is yet another variation of the output interface circuit shown in FIG. 29. Compared with the circuit shown in FIG. 29, a dumping resistor R27 is connected in parallel with the inductance Lloop to suppress resonance, which is generated by a LC resonance circuit comprised of the inductance Lloop and a parasitic capacitance. The isolation-purpose Josephson junction J21 is situated between the inductance Lloop and the high-voltage Josephson gate 212. Further, between the Josephson junction J21 and the high-voltage Josephson gate 212, a dumping network 255 is connected in parallel with the Josephson junction J1, and has a low impedance for preventing a high-frequency voltage oscillation from propagating to the SFQ circuit.

The dumping network 255 includes a resistor R28 having one end thereof connected to the junction between the Josephson junction J21 and the Josephson junction J1, and includes an inductance L23 connecting between the other end of the resistor R28 and the ground. Both or at least one of the dumping resistor R27 and the dumping network 255 may be provided. With the dumping resistor R27 and the dumping network 255, an effect of high frequency on the SFQ circuit of the preceding stage is suppressed, thereby allowing for an increase of an operating margin.

Figure 33:
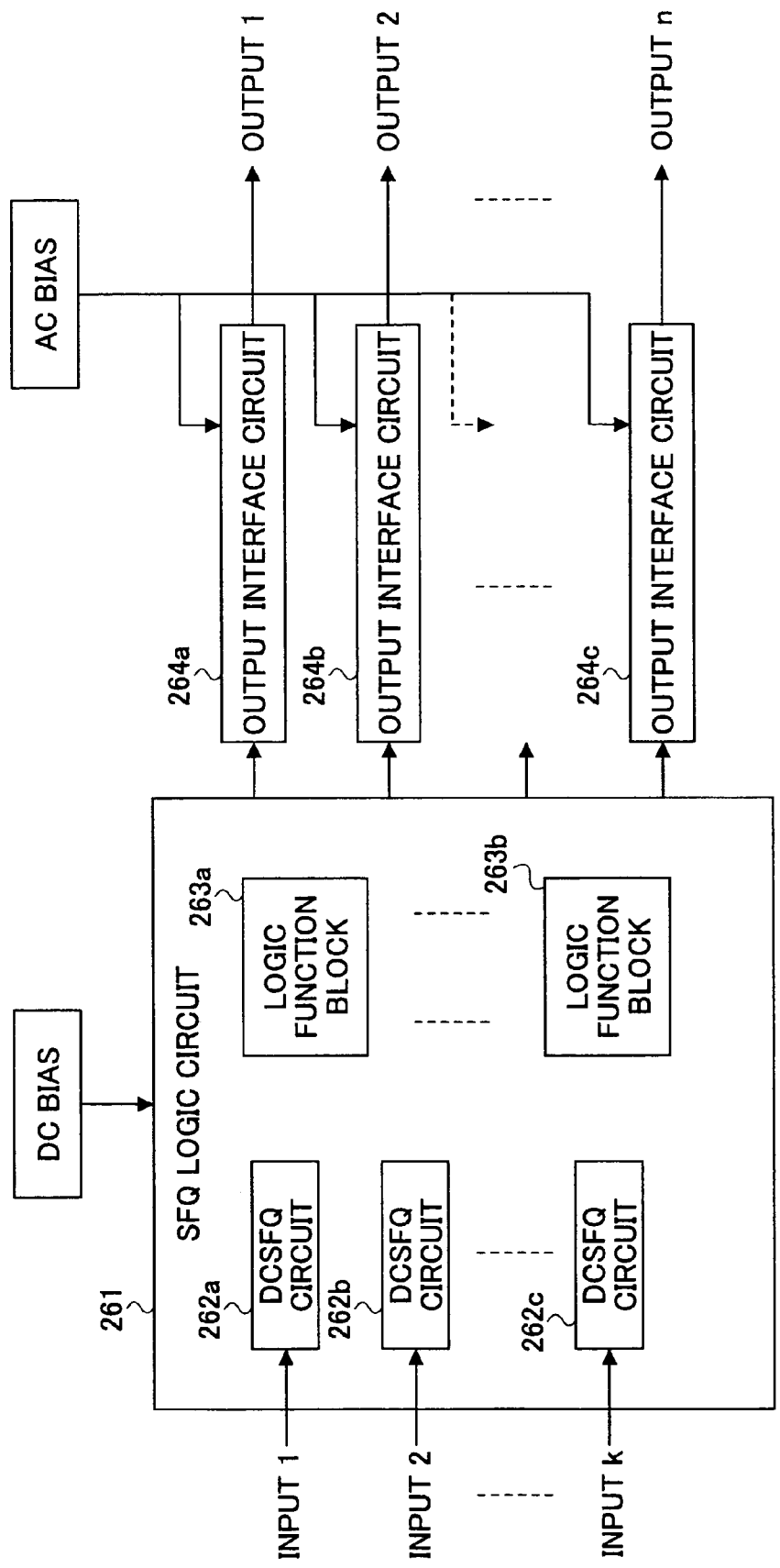
FIG. 33 is a block diagram showing an example of the construction for outputting parallel data by using a plurality of output interface circuits.

As described above, the output interface circuit according to this embodiment allows for an increase of an operating margin. This makes it viable to use a plurality of output interface circuits to output parallel data. FIG. 33 is a block diagram showing an example of the construction for outputting parallel data by using a plurality of output interface circuits according to the embodiment described above. As shown in FIG. 33, a plurality of input voltage pulses (input 1, input 2, . . . , input k) are supplied parallel to an SFQ logic circuit 261.

The SFQ logic circuit 261 includes a plurality of DCSFQ circuits 262a, 262b, and 262c and logic function blocks 263a and 263b. Each of the DCSFQ circuits 262a, 262b, and 262c converts a corresponding input voltage pulse into a SFQ pulse, which is processed by the logic function blocks 263a and 263b. The logic function blocks 263a and 263b supply output SFQ to output interface circuits 264a, 264b, and 264c. The output interface circuits 264a, 264b, and 264c output respective output voltages (output 1, output 2, . . . , output n) corresponding to the inputs. This achieves the parallel outputting of data.

As described above, the first embodiment brings about an advantage in that a large timing margin is allowed for between an SFQ output from the preceding SFQ circuit and an AC bias current. This leads to another advantage in that it is easy to adjust the phase of the AC bias. Further, since the number of circuit stages driven by AC biases is reduced compared to the related art, the amount of the AC bias current decreases, resulting in a ground ripple being suppressed. Moreover, the ground plane 241 on the side of the high-voltage Josephson gate 212 and the ground plane 242 on the side of the SFQ circuit are separated in respect of alternating currents, thereby further reducing the effect on the preceding SFQ circuit of a ground ripple caused by the AC bias current. Furthermore, the number of circuit stages is smaller than in the related art, the size of the circuit is reduced. This makes it possible to provide an output interface circuit usable in a high-density integrated circuit.

SECOND EMBODIMENT

Figure 34:
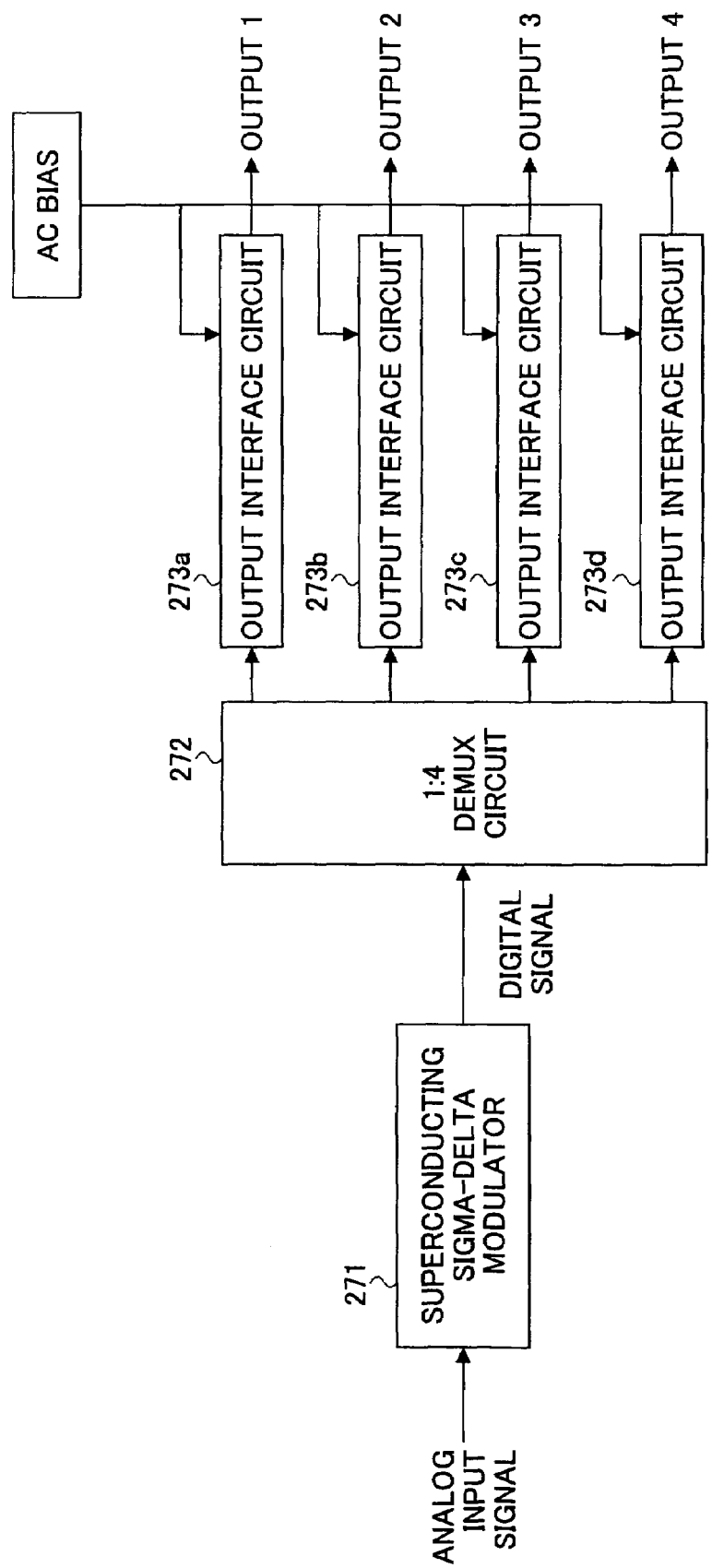
FIG. 34 is a block diagram showing an example of a front-end circuit for an A/D converter according to the third aspect of the invention.

FIG. 34 is a block diagram showing an example of a front-end circuit for an A/D converter according to the third aspect of the invention. As shown in FIG. 34, the front-end circuit for an A/D converter includes a superconducting sigma-delta modulator 271, a 1:4 demultiplexer circuit 272, and four output interface circuits 273a, 273b, 273c, and 273d. Each of the output interface circuits 273a, 273b, 273c, and 273d is implemented by using the output interface circuit of the first embodiment.

The superconducting sigma-delta modulator 271 converts an input analog signal into a digital signal comprised of SFQ pulses, which is supplied to the demultiplexer circuit 272. The demultiplexer circuit 272 applies serial-parallel conversion to the digital signal supplied from the superconducting sigma-delta modulator 271 for provision to the output interface circuits 273a, 273b, 273c, and 273d. The output interface circuits 273a, 273b, 273c, and 273d produce output voltages (output 1, output 2, output 3, output 4) corresponding to the respective inputs, thereby providing 4-bit digital signals. With this provision, the second embodiment provides a high-performance A/D converter.

The third aspect of the invention is not limited to the above embodiments, and may be modified in various ways. For example, in the first embodiment, one or more Josephson transmission lines may be provided as needed. Also, the construction of the gate and the number of stages thereof may be modified in the output interface circuit. In the second embodiment, the number of bits of digital signals is not limited to 4 bits, and the construction of an A/D converter may be modified in various ways.

As described above, the superconducting output interface circuit of the third aspect of the invention is in general useful for the superconducting integrated circuit that employs SFQ as an information carrier, and, in particular, useful as an output interface circuit for a high-performance A/D converter. The A/D converter according to the third aspect of the invention is useful to radio communications equipment and various measuring instruments that require high-performance A/D converters.

Further, the present invention is not limited to these embodiments, but various variations and modifications may be made without departing from the scope of the present invention.

What is claimed is:

1. A circuit, comprising:
   a first superconducting SFQ circuit;
   a first ground plane connected to a ground of said first superconducting SFQ circuit;
   a second superconducting SFQ circuit;
   a second ground plane connected to a ground of said second superconducting SFQ circuit;
   at least one stage of a separation-purpose superconducting SFQ circuit coupling between said first superconducting SFQ circuit and said second superconducting SFQ circuit;
   at least one ground plane connected to a ground of said at least one stage of a separation-purpose superconducting SFQ circuit; and
   wiring having inductance that is substantially nonzero, and provides coupling between said first ground plane, said at least one ground plane, and said second ground plane.

2. The circuit as claimed in claim 1, wherein said separation-purpose superconducting SFQ circuit allows an SFQ pulse to propagate therethrough, and includes one stage of a superconducting loop inclusive of said inductance, said one stage of a superconducting loop having total inductance that is less than about 10 pH.

3. The circuit as claimed in claim 2, wherein said separation-purpose superconducting SFQ circuit is a Josephson transmission line.

4. The circuit as claimed in claim 1, further comprising at least one of a resistor and an inductor provided along a path connecting between said at least one ground plane and an external ground potential.

5. The circuit as claimed in claim 1, wherein said separation-purpose superconducting SFQ circuit is driven by a DC bias that is substantially a direct current.

6. The circuit as claimed in claim 1, wherein a superconducting loop inclusive of said inductance in said separation-purpose superconducting SFQ circuit includes a resistance sufficiently small to allow an SFQ pulse to propagate therethrough.

* * * * *